(12) United States Patent
Kanna

(10) Patent No.: US 10,192,651 B2
(45) Date of Patent: *Jan. 29, 2019

(54) TRANSFER MATERIAL, METHOD OF MANUFACTURING TRANSFER MATERIAL, LAMINATED BODY, METHOD OF MANUFACTURING LAMINATED BODY, METHOD OF MANUFACTURING CAPACITANCE-TYPE INPUT DEVICE, AND METHOD OF MANUFACTURING IMAGE DISPLAY DEVICE

(71) Applicant: FUJIFILM CORPORATION, Minato-ku, Tokyo (JP)

(72) Inventor: Shinichi Kanna, Shizuoka-ken (JP)

(73) Assignee: FUJIFILM CORPORATION, Tokyo (JP)

( * ) Notice: Subject to any disclaimer, the term of this patent is extended or adjusted under 35 U.S.C. 154(b) by 104 days.

This patent is subject to a terminal disclaimer.

(21) Appl. No.: 15/347,780

(22) Filed: Nov. 10, 2016

(65) Prior Publication Data

US 2017/0154704 A1    Jun. 1, 2017

(30) Foreign Application Priority Data

Nov. 26, 2015 (JP) ................................. 2015-230619

(51) Int. Cl.
*C09D 131/04* (2006.01)
*H01B 3/30* (2006.01)
(Continued)

(52) U.S. Cl.
CPC ........... *H01B 3/303* (2013.01); *C08G 18/673* (2013.01); *C08G 18/8061* (2013.01);
(Continued)

(58) Field of Classification Search
CPC ... B32B 7/02; B32B 7/20; B32B 2203/04103; B32B 2264/102; B32B 2307/412;
(Continued)

(56) References Cited

FOREIGN PATENT DOCUMENTS

JP    2005-208559 A    8/2005
JP    2015-153009 A    8/2015

OTHER PUBLICATIONS

Office Action dated Nov. 27, 2018, issued by the JPO in corresponding Japanese Patent Application No. 2015-230619.

*Primary Examiner* — Bruce H Hess
(74) *Attorney, Agent, or Firm* — SOLARIS Intellectual Property Group, PLLC

(57) ABSTRACT

A transfer material and a method of manufacturing the same, the transfer material including, in this order, a temporary support body, a first resin layer, and a second resin layer, the first resin layer not being water soluble, the second resin layer including a water soluble polymer, the second resin layer including a compound that has a heteroaromatic ring including a nitrogen atom as a ring member, and a content of the compound that has a heteroaromatic ring including a nitrogen atom as a ring member in the second resin layer being 3.0% by mass or greater with respect to a total solid content of the second resin layer. A laminated body including a substrate; an electrode pattern that is positioned above the substrate and that includes a metal in at least part of the electrode pattern; a second resin layer positioned above the electrode pattern; and a first resin layer positioned above the second resin layer, the second resin layer including a compound that has a heteroaromatic ring including a nitrogen atom as a ring member.

21 Claims, 9 Drawing Sheets

(51) Int. Cl.
*C09D 129/04* (2006.01)
*C09D 133/08* (2006.01)
*C09D 133/12* (2006.01)
*C09D 175/14* (2006.01)
*G06F 3/044* (2006.01)
*H05K 3/00* (2006.01)
*H05K 3/46* (2006.01)
*C08G 18/67* (2006.01)
*C08G 18/80* (2006.01)
*C08L 33/06* (2006.01)
*C09D 4/06* (2006.01)

(52) U.S. Cl.
CPC ................ *C08L 33/06* (2013.01); *C09D 4/06* (2013.01); *C09D 129/04* (2013.01); *C09D 131/04* (2013.01); *C09D 133/08* (2013.01); *C09D 133/12* (2013.01); *C09D 175/14* (2013.01); *G06F 3/044* (2013.01); *H05K 3/007* (2013.01); *H05K 3/4644* (2013.01); *G06F 2203/04103* (2013.01)

(58) Field of Classification Search
CPC ........... B32B 2457/208; G06F 3/03547; G06F 3/041; G06F 3/0412; G06F 3/044; G06F 2203/04104
USPC ...................................................... 428/32.77
See application file for complete search history.

TRANSFER MATERIAL, METHOD OF MANUFACTURING TRANSFER MATERIAL, LAMINATED BODY, METHOD OF MANUFACTURING LAMINATED BODY, METHOD OF MANUFACTURING CAPACITANCE-TYPE INPUT DEVICE, AND METHOD OF MANUFACTURING IMAGE DISPLAY DEVICE

CROSS-REFERENCE TO RELATED APPLICATION

This application claims priority under 35 USC 119 from Japanese Patent Application No. 2015-230619, filed Nov. 26, 2015, the disclosure of which is incorporated herein by reference in its entirety.

TECHNICAL FIELD

The present invention relates to a transfer material, a method of manufacturing a transfer material, a laminated body, a method of manufacturing a laminated body, a method of manufacturing a capacitance-type input device, and a method of manufacturing an image display device.

RELATED ART

Recently, in electronic devices such as cellular phones, car navigation equipment, personal computers, ticket vending machines, and bank terminals, sometimes tablet-type input devices are placed on surfaces of liquid crystal devices and the like, and information corresponding to an instruction image can be input by using a finger, stylus, or the like to touch a location where the instruction image is displayed in an image display region of the liquid crystal device while referring to the instruction image.

Examples of such input devices (touch panels) include resistive film types and capacitance-type types. Resistive input devices have structures in which a film in a two-layer structure of a film and glass is pushed down to create a short circuit, and this gives rise to demerits of having a narrow operational temperature range and susceptibility to changes over time.

In contrast thereto, capacitance-type input devices have the advantage of it being sufficient to form translucent conductive film on a single substrate alone. In some types of such capacitance-type input devices, for example, electrode patterns are present extending in mutually intersecting directions, and input positions are detected by sensing changes in the capacitance between the electrodes when touched by a finger or the like.

There are proposals to laminate a transfer material onto a substrate when manufacturing capacitance-type input devices. For example, a transfer material and a photosensitive sheet described in Japanese Patent Application Laid-Open (JP-A) Nos. 2005-208559 and 2015-153009 are known.

JP-A No. 2005-208559 describes a photosensitive sheet including, a support body, a first photosensitive layer, and a second photosensitive layer in this order; in which the first photosensitive layer and the second photosensitive layer each independently include a binder, a polymerizable compound, and a photopolymerization initiator, and in which the photosensitivity of the second photosensitive layer is greater than the photosensitivity of the first photosensitive layer.

JP-A No. 2015-153009 describes a method of manufacturing a touch panel substrate provided with a protective film, in which a photosensitive layer that includes a photosensitive resin composition including a binder polymer, a photopolymerizable compound that includes a (meth)acrylate compound having a skeleton derived from a fluorene, a photopolymerization initiator, and fine metal oxide particles is provided on a touch panel substrate, and a specific portion of the photosensitive layer is cured by irradiation with actinic light and portions other than the specific portion of the photosensitive layer are then removed, thereby forming a protective film including the cured product of the photosensitive resin composition that covers a portion or all of the substrate.

SUMMARY OF THE INVENTION

Capacitance-type input devices are known in which a transparent electrode pattern formed from indium tin oxide (ITO) or the like is employed as a touch detection electrode, and capacitance-type input devices are known in which a metal electrode pattern of fine metal wiring lines formed from a metal such as copper, a copper alloy, or an aluminum alloy is employed.

In devices in which a transparent electrode pattern is employed, an electrode formed from a metal such as copper, a copper alloy, or an aluminum alloy is formed as a metal wiring section in what is known as a frame region, which is the periphery of the transparent electrode.

In the present disclosure, an electrode pattern that include the transparent electrode pattern and a metal wiring section, and a metal electrode pattern with the fine metal wiring lines are referred to as "electrode patterns that include metal in at least part of the electrode pattern". Moreover, metal locations included in electrode patterns that include metal in at least part of the electrode pattern are simply referred to as "metal electrodes".

The present inventors have discovered the following problem. In cases in which an ordinary curable film has been employed as an insulating layer or a protective layer for a touch panel including an electrode pattern that includes metal in at least part of the electrode pattern, the metal electrodes sometimes corrode due to being employed over long periods of time. This corrosion is thought to occur due to sweat of users and salts in their sweat passing through the insulating layer or the protective layer and contacting the metal electrode, so as to corrode the metal electrode.

JP-A No. 2005-208559 describes a method of forming a resist during production of a printed wiring substrate using a transfer material, but does not describe methods of forming insulating layers, protective layers, or the like.

JP-A No. 2015-153009 describes a method of manufacturing a rust-proof protective film, but the protective film is a single layer, and there are problems related to the strength of the protective film, i.e. the scratch resistance thereof, compared to insulating layers and/or protective layers produced using the transfer material of the present disclosure.

An embodiment of the invention provides: a transfer material, employed in the formation of insulating layers and/or protective layers, and capable of forming an insulating layer and/or protective layer that have metal electrodes with excellent corrosion resistance, and that have excellent scratch resistance; a method of manufacturing the transfer material; a laminated body; and a method of manufacturing the laminated body.

Moreover, an embodiment of the invention provides a method of manufacturing a capacitance-type input device prepared using the transfer material, and a method of manufacturing an image display device prepared using the transfer material.

Aspects of the invention include the following aspects <1>, <8> to <10>, <12> to <14>. Preferable aspects <2> to <7>, <11>, and <15> to <21> are also described below.

<1> A transfer material including, in this order, a temporary support body, a first resin layer, and a second resin layer, the first resin layer not being water soluble, the second resin layer including a water soluble polymer, the second resin layer including a compound that has a heteroaromatic ring including a nitrogen atom as a ring member, and a content of the compound that has a heteroaromatic ring including a nitrogen atom as a ring member in the second resin layer being 3.0% by mass or greater with respect to a total solid content of the second resin layer.

<2> The transfer material of <1>, in which the content of the compound that has a heteroaromatic ring including a nitrogen atom as a ring member is from 3.0% by mass to 20.0% by mass with respect to the total solid content of the second resin layer.

<3> The transfer material of <1> or <2>, in which the heteroaromatic ring including a nitrogen atom as a ring member is at least one ring selected from the group consisting of an imidazole ring, a triazole ring, a tetrazole ring, a thiadiazole ring, and a fused ring of any of these rings and another aromatic ring.

<4> The transfer material of <1> or <2>, in which the compound that has a heteroaromatic ring including a nitrogen atom as a ring member is a benzotriazole compound.

<5> The transfer material of any one of <1> to <4>, in which the first resin layer either does not include a compound that has a heteroaromatic ring including a nitrogen atom as a ring member, or includes the compound that has a heteroaromatic ring including a nitrogen atom as a ring member in an amount of more than 0% by mass and 10.0% by mass or less with respect to a total solid content of the first resin layer.

<6> The transfer material of any one of <1> to <5>, in which the first resin layer includes a polymerizable compound and a photopolymerization initiator.

<7> The transfer material of any one of <1> to <6>, in which the first resin layer is an alkali-developable layer.

<8> A method of manufacturing a transfer material, the method including: forming a first resin layer on a temporary support body; and forming a second resin layer above the first resin layer, the first resin layer not being water soluble, the second resin layer including a water soluble polymer, the second resin layer including a compound that has a heteroaromatic ring including a nitrogen atom as a ring member, and a content of the compound that has a heteroaromatic ring including a nitrogen atom as a ring member in the second resin layer being 3.0% by mass or greater with respect to a total solid content of the second resin layer.

<9> A laminated body manufactured by transferring the transfer material of any one of <1> to <7> to above an electrode pattern positioned above a substrate and including a metal in at least a part of the electrode pattern.

<10> A method of manufacturing a laminated body, the method including: transferring the first resin layer and the second resin layer from the transfer material of any one of <1> to <7> to above an electrode pattern that is positioned above a substrate and that includes a metal in at least a part of the electrode pattern; and peeling off the temporary support body.

<11> The method of manufacturing the laminated body of <10>, further including patterning the first resin layer that has been transferred to above the electrode pattern.

<12> A method of manufacturing a capacitance-type input device, the method including: transferring the first resin layer and the second resin layer from the transfer material of any one of <1> to <7> to above an electrode pattern positioned above a substrate and including a metal in at least a part of the electrode pattern; and peeling off the temporary support body.

<13> A method of manufacturing an image display device, the method including: transferring the first resin layer and the second resin layer from the transfer material of any one of <1> to <7> to above an electrode pattern that is positioned above a substrate and that includes a metal in at least part of the electrode pattern; and peeling off the temporary support body.

<14> A laminated body including: a substrate; an electrode pattern that is positioned above the substrate and that includes a metal in at least part of the electrode pattern; a second resin layer positioned above the electrode pattern; and a first resin layer positioned above the second resin layer, the second resin layer including a compound that has a heteroaromatic ring including a nitrogen atom as a ring member.

<15> The laminated body of <14>, in which the electrode pattern and the second resin layer are adjacent.

<16> The laminated body of <14> or <15>, in which the second resin layer includes a water soluble polymer, and a content of the water soluble polymer in the second resin layer is from 2% by mass to 95% by mass with respect to a total solid content of the second resin layer.

<17> The laminated body of any one of <14> to <16>, in which the substrate is a film substrate.

<18> The laminated body of <17>, in which each face of the film substrate includes the electrode pattern, the first resin layer, and the second resin layer.

<19> The laminated body of any one of <14> to <18>, in which the electrode pattern includes a metal wiring section.

<20> The laminated body of <19>, including a compound that has a heteroaromatic ring including a nitrogen atom as a ring member above the metal wiring section in a region from which the first resin layer and the second resin layer have been removed.

<21> The laminated body of any one of <14> to <20>, in which the first resin layer and the second resin layer are patterned.

An embodiment of the invention can provide: a transfer material employed in the formation of insulating layers and/or protective layers, and capable of forming an insulating layer and/or protective layer that have metal electrodes with excellent corrosion resistance, and that have excellent scratch resistance; a method of manufacturing the transfer material; a laminated body; and a method of manufacturing the laminated body.

Moreover, an embodiment of the invention can provide a method of manufacturing a capacitance-type input device prepared using the transfer material, and a method of manufacturing an image display device prepared using the transfer material.

DETAILED DESCRIPTION OF THE INVENTION

Figure 1:
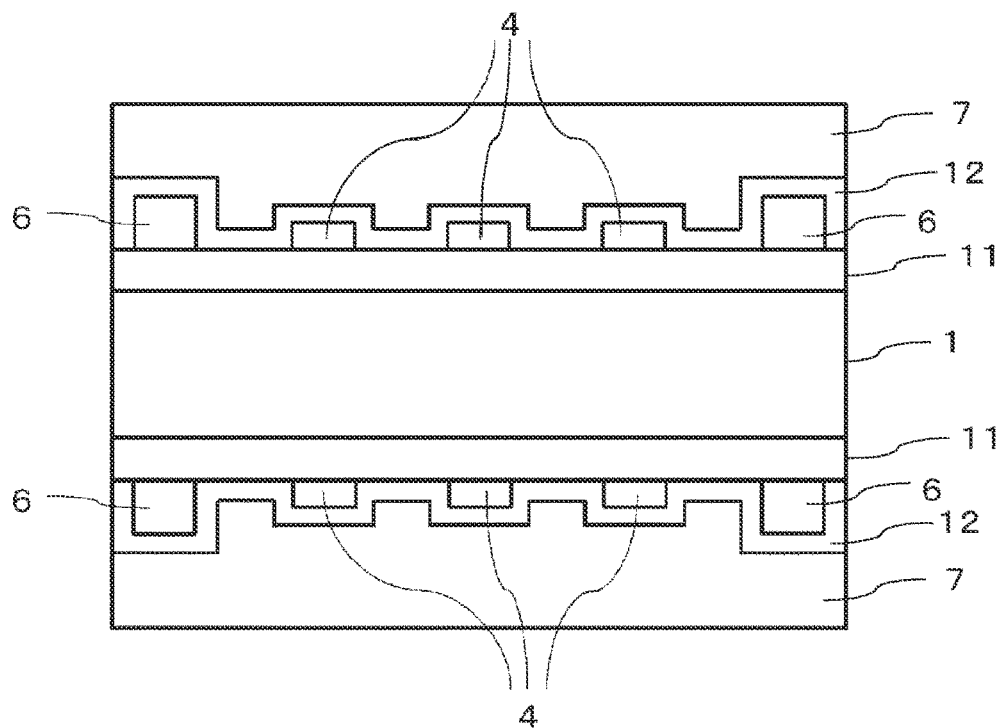
FIG. 1 is a schematic cross-section diagram illustrating an example of a configuration of a capacitance-type input device of the present disclosure.

Detailed explanation follows regarding an embodiment of the invention. The configuration conditions in the following explanation can be based on an embodiment that is exemplary of the present invention, but the invention is not limited to such embodiment. In the present specification, numerical ranges described using "to" indicate ranges that include both the minimum value and the maximum value before and after the "to" used to describe the numerical range. Moreover, organic EL elements refer to organic electroluminescence elements.

In the present specification, mentions of groups (groups of atoms) encompass forms that have no substituents as well as forms that have substituents in cases in which the representation does not mention a substitution or lack of substitution. For example, the term "alkyl group" encompasses not only alkyl groups having no substituents (unsubstituted alkyl groups), but also encompasses alkyl groups having a substituent (substituted alkyl groups).

In the present specification, the term "(meth)acrylate" refers to an acrylate and a methacrylate, the term "(meth)acrylic" refers to an acrylic and a methacrylic, and the term "(meth)acryloyl" refers to an acryloyl and a methacryloyl.

In the present disclosure, the term "% by mass" and the term "% by weight" are synonymous, and the term "parts by mass" and the term "parts by weight" are synonymous.

In the present disclosure, a combination of preferable embodiment is more preferable.

In the present disclosure, molecular weights of polymer components are in terms of polystyrene equivalent weight-average molecular weights measured by gel permeation chromatography (GPC) when tetrahydrofuran (THF) is the solvent.

In the present specification, total solid content refers to the total mass of non-volatile components when solvents and the like have been removed from the layer, composition, or the like.

(Transfer Material)

The transfer material of the present disclosure includes a temporary support body, a first resin layer, and a second resin layer, in this order; the first resin layer not being water soluble; the second resin layer including a water soluble polymer; the second resin layer including a compound that has a heteroaromatic ring including a nitrogen atom as a ring member; and the content of the compound that has a heteroaromatic ring including a nitrogen atom as a ring member in the second resin layer being 3.0% by mass or more with respect to the total solid content of the second resin layer.

The first resin layer is preferably adjacent to the second resin layer.

This configuration enables a transfer material to be obtained that is capable of forming an insulating layer and/or a protective layer that has metal electrodes with excellent corrosion resistance, and that has excellent scratch resistance.

The transfer material of the present disclosure may be a negative-acting material or a positive-acting material.

In cases in which the transfer material of the present disclosure is a negative-acting material, the resin layers preferably include a binder resin (preferably an alkali soluble resin), a polymerizable compound, a polymerization initiator, or a polymerization initiator system. Employed additives and the like are not limited thereto.

The first resin layer and the second resin layer of the transfer material of the present disclosure preferably each independently include a binder resin, a polymerizable compound, and a photopolymerization initiator.

Explanation follows regarding the temporary support body, the first resin layer, and the second resin layer, in this order.

<Temporary Support Body>

The transfer material of the present disclosure includes a temporary support body.

The temporary support body is a support body that is peeled off after the first resin layer and the second resin layer included in the transfer material have been transferred.

A material that is flexible and that does not undergo notable deformation, compression, or extension under pressure, or under heating and pressure, is preferably employed as the temporary support body. Examples of such temporary support bodies include a polyester film such as a polyethylene terephthalate film, a cellulose triacetate film, a polystyrene film, and a polycarbonate film. Among these, a polyester film is preferable, a polyethylene terephthalate film is more preferable, and a biaxially stretched polyethylene terephthalate film is still more preferable.

The thickness of the temporary support body is not particularly limited, and is preferably within a range of from 5 µm to 200 µm, and, from the viewpoints of ease of handling, versatility, and the like, is more preferably within a range of from 10 µm to 50 µm.

The temporary support body may be transparent, and may include silicon oxide, ALUMINASOL, chromium salts, zirconium salts, or the like.

Moreover, the temporary support body may be made electrically conductive in accordance with, for example, the method described in JP-A No. 2005-221726.

<First Resin Layer>

The first resin layer of the present disclosure is preferably photosensitive. The term "photosensitive" refers to the characteristic of having a degree of solubility in developing liquid that changes due to irradiation with light.

The photosensitivity of the first resin layer enables the transfer material of the present disclosure to be employed as either a positive-acting material or a negative-acting material.

From the viewpoint that the transfer material of the present disclosure is preferably a negative-acting material, the first resin layer is preferably a photocurable layer.

As long as the first resin layer is photosensitive, the second resin layer need not be photosensitive; however, it is preferable that the first resin layer and the second resin layer are both photosensitive, and it is particularly preferable that the first resin layer and the second resin layer are both photocurable.

From the viewpoint of the physical durability of the cured film after curing, the first resin layer of the present disclosure is preferably photocurable and thermocurable.

Moreover, the first resin layer is preferably an alkali-developable layer. Alkali-developable layer refers to a layer that exhibits solubility and/or swellability when brought into contact with an alkaline aqueous solution.

The first resin layer of the present disclosure preferably includes a polymerizable compound and a photopolymerization initiator. Inclusion of a polymerizable compound and a photopolymerization initiator in the first resin layer of the present disclosure makes the first resin layer of the present disclosure a photocurable layer.

The first resin layer more preferably further includes a binder polymer, and may further include other additives.

The material of the first resin layer is not particularly limited, and a freely selected binder polymer or polymerizable compound may be employed therefor; however, from the viewpoint of employment as a transparent protective film of a capacitance-type input device, a material having high surface hardness and heat tolerance is preferable. Among binder polymers and the polymerizable compound, known photosensitive siloxane resin materials, acrylic resin materials, or the like are preferably employed.

From the viewpoint that the first resin layer preferably is alkali-developable, an alkali soluble resin is preferably included as the binder polymer.

Moreover, it is preferable that the first resin layer either does not include the specific compound that is described below, or includes the compound that has the heteroaromatic ring including a nitrogen atom as a ring member in a content of more than 0% by mass and 10.0% by mass or less with respect to the total solid content of the first resin layer. It is more preferable that the first resin layer either does not include the specific compound that is described below, or includes the compound that has a heteroaromatic ring including a nitrogen atom as a ring member in a content of more than 0% by mass and 8.0% by mass or less with respect to the total solid content of the first resin layer.

This configuration enables an insulating layer and/or a protective layer that have metal electrodes with excellent corrosion resistance, and that have excellent scratch resistance to be formed.

Details of each component included in the first resin layer are described below.

[Binder Polymer]

The first resin layer preferably includes a binder polymer. The binder polymer is not particularly limited as long as the binder polymer does not conflict with the spirit of the present disclosure, and the binder polymer may be suitably selected from out of known substances. The binder polymer is preferably an alkali soluble resin, and the polymers described in paragraph 0025 of JP-A No. 2011-95716 and paragraphs 0033 to 0052 of JP-A No. 2010-237589 may be employed as the alkali soluble resin. Among these, an acrylic polymer having an acid group is preferable.

A known photosensitive siloxane resin material, acrylic resin material, or the like is preferably employed as the binder polymer.

The binder polymer may be included in the form of a polymer solution in which a polymer is dissolved in a solvent. The solvent is not particularly limited, and a solvent ordinarily employed to dissolve polymers may be employed therefor, and such examples include 1-methoxy-2-propyl acetate, 1-methoxy-2-propanol, and methyl ethyl ketone.

The difference between the SP value of any binder polymer included in the first resin layer and the SP value of the water soluble polymer included in the second resin layer, described later, is preferably 1.02 $MPa^{1/2}$ or greater, is more preferably 1.53 $MPa^{1/2}$ or greater, and is particularly preferably 2.04 $MPa^{1/2}$ or greater.

This configuration further improves layer demarcation.

In the present disclosure, SP value refers to a solubility parameter calculated in accordance with the Okitsu method (Adhesion, vol. 38, issue. 6, p. 6 (1994) Polymer Publishing), and has units of $MPa^{1/2}$. The SP value is obtained by giving a molar attraction constant and a molar volume to each unit in the molecular structure.

The content of the binder polymer in the first resin layer is from 2% by mass to 95% by mass, is preferably from 5% by mass to 90% by mass, and is more preferably from 10% by mass to 80% by mass, with respect to the total solid content of the first resin layer.

[Polymerizable Compound]

The first resin layer preferably includes a polymerizable compound.

The polymerizable compound is preferably a radical polymerizable compound.

Examples of the polymerizable compound that may be employed in the first resin layer include: a monofunctional acrylate and amonofunctional methacrylate such as polyethylene glycol mono(meth)acrylate, polypropylene glycol mono(meth)acrylate, or phenoxyethyl(meth)acrylate; polyethylene glycol di(meth)acrylate, polypropylene glycol di(meth)acrylate, trimethylolethane tri(meth)acrylate, trimethylolpropane tri(meth)acrylate, trimethylolpropane di(meth)acrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri((meth)acryloyloxypropyl)ether, tri((meth)acryloyloxyethyl)isocyanurate, tri((meth)acryloyloxyethyl)

cyanurate, glycerin tri(meth)acrylate; and a polyfunctional acrylate and a polyfunctional methacrylate such as a product obtained by (meth)acrylating the product of adding ethylene oxide or propylene oxide to a polyfunctional alcohol such as trimethylolpropane or glycerin.

The polymerizable compound may be employed singly, or in a combination of two or more kinds thereof.

Further examples include: the urethane acrylates described in Japanese Patent Application Publication (JP-B) Nos. S48-41708 and S50-6034, and Japanese Patent Application Laid-Open (JP-A) No. S51-37193; the polyester acrylates described in JP-A No. S48-64183 and JP-B Nos. S49-43191 and S52-30490; and polyfunctional acrylates and methacrylates such as epoxy acrylates, which are reaction products given of epoxy resins and (meth)acrylic acid. Moreover, an acrylamide monomer such as that represented by Formula (1) below may also be preferably employed. Among the polymerizable compounds described above, the polyfunctional acrylate, the urethane acrylate and the acrylamide monomer are preferable.

Formula (1)

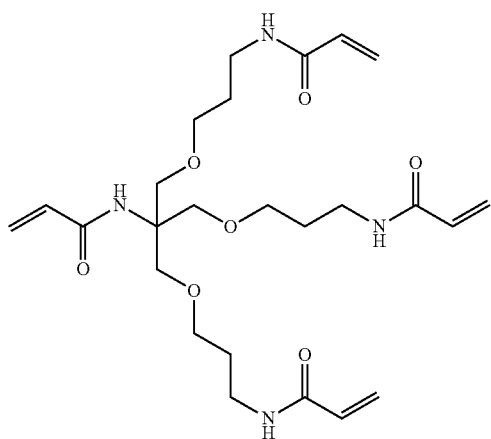

The content of the polymerizable compound in the first resin layer is preferably 1% by mass or greater, is more preferably 2% by mass or greater, and is particularly preferably 3.0% by mass or greater, with respect to the total solid content of the first resin layer. Although there are no particular limitations to the maximum, the content of the polymerizable compound in the first resin layer is preferably 10.0% by mass or less with respect to the total solid content of the first resin layer.

[Polymerization Initiator]

The first resin layer preferably includes a polymerization initiator.

The polymerization initiator employed in the first resin layer is preferably a photopolymerization initiator, and is preferably a photo-radical polymerization initiator.

The photo-radical polymerization initiator is not particularly limited, and a known photo-radical polymerization initiator may be employed.

Specific examples thereof include trihalomethyl group-containing compounds, acridine compounds, acetophenone compounds, biimidazole compounds, benzoin compounds, benzophenone compounds, α-diketone compounds, polynuclear quinone compounds, xanthone compounds, diazo compounds, acylphosphine oxide compounds, titanocene compounds, and oxime ester compounds.

Of the above, it is preferable to include at least one kind selected from trihalomethyl group-containing compounds, acridine compounds, acetophenone compounds, biimidazole-based compounds, acylphosphine oxide compounds, or oxime ester compounds, it is more preferable to include at least one kind selected from acylphosphine oxide compounds or oxime ester compounds, and it is still more preferable to include at least one kind selected from oxime ester compounds.

The photopolymerization initiator described in paragraphs 0031 to 0042 of JP-A No. 2011-95716 may be employed as the photopolymerization initiator. Preferably employed examples include 2-(benzoyloxyimino)-1-[4-(phenylthio)phenyl]-1-octanone (trade name: IRGACURE OXE-01, manufactured by BASF SE),
6-[1-(acetyloxyimino)ethyl]-9-ethyl-9H-carbazole-3-yl(2-methylphenyl)ketone (trade name: IRGACURE OXE-02, manufactured by BASF SE),
2-(dimethylamino)-2-[(4-methylphenyl)methyl]-1-[4-(4-morpholinyl)phenyl]-1-butanone (trade name: IRGACURE 379 EG, manufactured by BASF SE),
2-methyl-1-(4-methylthiophenyl)-2-morpholinopropane-1-one (trade name: IRGACURE 907, manufactured by BASF SE),
2-hydroxy-1-{4-[4-(2-hydroxy-2-methylpropionyl)benzyl]phenyl}-2-methyl-propane-1-one (trade name: IRGACURE 127, manufactured by BASF SE),
2-benzyl-2-dimethylamino-1-(4-morpholinophenyl)butanone-1 (trade name: IRGACURE 369, manufactured by BASF SE), 2-hydroxy-2-methyl-1-phenyl-propane-1-one (trade name: IRGACURE 1173, manufactured by BASF SE), 1-hydroxy-cyclohexyl-phenyl-ketone (trade name: IRGACURE 184, manufactured by BASF SE),
2,2-dimethoxy-1,2-diphenylethane-1-one (trade name: IRGACURE 651, manufactured by BASF SE), and LUNAR 6 (manufactured by DKSH Japan KK).

The content of the polymerization initiator in the first resin layer is preferably 1% by mass or greater, is more preferably 2.0% by mass or greater, and is particularly preferably 3.0% by mass or greater, with respect to the total solid content of the first resin layer. Although there are no particular limitations to the maximum, the content of the polymerization initiator in the first resin layer is preferably 10.0% by mass or less with respect to the total solid content of the first resin layer.

The photopolymerization initiator may be employed singly, or in a combination of two or more kinds thereof.

[Solvent]

The first resin layer may include a solvent.

An ordinary organic solvent may be employed as the solvent, and examples thereof include methyl ethyl ketone, propylene glycol monomethyl ether, propylene glycol monomethyl ether acetate, cyclohexanone, methyl isobutyl ketone, toluene, xylene, ethyl acetate, butyl acetate, ethyl lactate, methyl lactate, and caprolactam.

The solvent may be employed singly, or in a combination of two or more kinds thereof.

In the transfer material of the present disclosure, in case that the first resin layer is formed above the temporary support body, it is preferable to employ a method in which a coating liquid for forming a first resin layer is prepared by dissolving or mixing each component to be included in the first resin layer in the solvent, and the coating liquid is coated onto the temporary support body and dried.

At least a portion of the solvent included in the first resin layer is preferably removed by the drying.

More specifically, the content of the solvent in the first resin layer after the drying is preferably from 0% by mass to 10% by mass, is more preferably from 0% by mass to 5% by mass, is still more preferably from 0% by mass to 2% by mass, is particularly preferably from 0% by mass to 1% by mass, with respect to the total mass of the first resin layer, and it is most preferable not to include the solvent after the drying.

[Other Additives]

Additives may be employed in the first resin layer. Examples of these additives include the surfactants described in paragraph 0017 of Japanese Patent No. 4502784 and paragraphs 0060 to 0071 of JP-A No. 2009-237362, the thermal polymerization inhibitor described in paragraph 0018 of Japanese Patent No. 4502784, and other additives described in paragraphs 0058 to 0071 of JP-A No. 2000-310706.

These additives may be employed singly, or in a combination of two or more kinds thereof.

[Properties of First Resin Layer]

—Layer Solubility—

In the transfer material of the present disclosure, the first resin layer is not water soluble. The second resin layer, described below, is preferably water soluble.

In the present disclosure, according to an embodiment in which the first resin layer is not water soluble and the second resin layer includes a water soluble polymer, layer demarcation is excellent and dispersion of the compounds included in each layer is suppressed, such that an insulating layer and/or a protective layer having excellent scratch resistance and having electrodes with excellent corrosion resistance can be formed, even if, after the first resin layer has been stacked above the temporary support body, the second resin layer is stacked above the first resin layer without curing the first resin layer. Moreover, after each layer has been transferred from the transfer material, a desired pattern can be developed using photolithography.

A layer being water soluble means that the layer will completely dissolve and/or disperse within an immersion time of 10 minutes per μm of film thickness when immersed in 25° C. water.

A layer not being water soluble means that the layer will not completely dissolve and/or disperse within an immersion time of 10 minutes per μm of film thickness when immersed in 25° C. water.

—Transmittance—

In the transfer material of the present disclosure, it is preferable that the first resin layer is a transparent resin layer, and it is more preferable that the first resin layer and the second resin layer, described below, are both transparent resin layers.

In the present disclosure, the expression "transparent resin layer" refers to a laminated body that has a transmittance of 80% or greater when the laminated body has been formed by transferring a resin layer onto a substrate having a transmittance of 90% or greater. The minimum value of transmittance measured over a wavelength range of from 400 nm to 780 nm at a 1 nm pitch may be employed as the transmittance.

In the case in which the transparent resin layer of the transfer material is photocurable and/or thermocurable, the optical transmittance after curing is similarly preferably 80% or greater. In the case of being photocurable, the entire surface is exposed after the transparent resin layer has been transferred such that the resin layer makes contact with a glass substrate as described above, and the temporary support body is peeled off. Next, development and rinsing with water are performed, and excess water is removed and dried using an air knife. The transmittance of the obtained transparent resin layer-provided glass substrate is similarly measured using a spectrophotometer. After removal and drying by the air knife, post exposure may be carried out. In the case of having both thermocurability and photocurability, a final baking is performed and measurements are made similarly.

In the case of being thermocurable, the transparent resin layer is transferred so as to make contact with the glass substrate as described above, the temporary support body is then peeled off, and baking is performed. The transmittance of the obtained transparent resin layer-provided glass substrate is similarly measured using a spectrophotometer. The transparency of the transparent resin layer before curing and the transparency of the transparent resin layer after curing are both preferably high, and the transmittance of the transparent resin layer before curing and the transmittance of the transparent resin layer after curing are both preferably high.

—Refractive Index and Dry Film Thickness—

Although not particularly limited, the refractive index of the first resin layer in the present disclosure is preferably less than 1.60, and is more preferably 1.55 or less. Although not particularly limited, the lower bound of the refractive index of the first resin layer is preferably 1.20 or greater. Hereafter, the term "refractive index" in the present disclosure is a value at 25° C., unless stated otherwise.

From the viewpoint of exhibiting sufficient surface protection during forming a transparent protective layer of the capacitance-type input device, the dry film thickness of the first resin layer of the present disclosure is preferably 1 μm or greater, is more preferably from 1 μm to 15 μm, is still more preferably from 2 μm to 12 μm, and is particularly preferably from 3 μm to 10 μm.

—Refractive Index of Transfer Material and Measurement Method of Dry Film Thickness—

In the present disclosure, the refractive index and the dry film thickness of the first resin layer, and the refractive index and the dry film thickness of the second resin layer described below, can be found as described below using a reflective film thickness monitor FE-3000 (manufactured by Otsuka Electronics Co., Ltd.). The measurement below is performed under 25° C. conditions.

(1) A temporary support body is prepared and cut out so as to have vertical-horizontal sides of length 10 cm×10 cm. A laminated body (a first laminated body) is prepared that places a black polyethylene terephthalate (PET) material in contact with one surface of the cut out temporary support body, with transparent adhesive tape (optically clear adhesive tape (OCA tape) 8171CL, manufactured by 3M Company) interposed therebetween. A reflectance spectrum (wavelengths of 430 nm to 800 nm) of the first laminated body is evaluated using a reflective film thickness monitor FE-3000, and refractive indexes $n_0$ of the temporary support body are found at respective wavelengths.

(2) A sample in which only the first resin layer has been formed above the temporary support body is prepared, and cut out so as to have vertical-horizontal sides of length 10 cm×10 cm. A laminated body (a second laminated body) is prepared that places a black PET material in contact with the temporary support body surface of the cut out sample with transparent adhesive tape (OCA tape 8171CL, manufactured by 3M Company) interposed therebetween. The second laminated body is structurally analyzed using transmission electron microscopy (TEM). The dry film thickness of the first resin layer is measured at 10 points and an average value is found, and a first estimated value $T_1$ (I) of the average value of the dry film thickness of the first resin layer is found. The reflectance spectrum (at wavelengths of 430 nm to 800 nm) of the second laminated body is evaluated using a reflective film thickness monitor FE-3000. A refractive index $n_1$ of the first resin layer at each wavelength and a second estimated value $T_1$ (II) of the average value of the dry film thickness of the first resin layer are found. When this is performed, in order to take into consideration reflection at the interface between the first resin layer and the temporary support body, the refractive indexes $n_1$ and the second estimated value $T_1$ (II) are found from the reflectance spectrum of the second laminated body in accordance with a simulation calculation to perform fitting in a state in which the value of the refractive indexes $n_0$ found by (1) above and the first estimated value $T_1$ (I) have been substituted into a calculation equation.

(3) A transfer material in which the first resin layer and the second resin layer have been formed above the temporary support body is prepared and cut out so as to have vertical-horizontal sides of length 10 cm×10 cm (in cases in which a protective film is included, the protective film is peeled off). A sample piece (a third laminated body) is prepared that places a black PET material in contact with the temporary support body surface of the cut out transfer material with a transparent adhesive tape (OCA tape 8171CL, manufactured by 3M Company) interposed therebetween. The structural analysis of the sample piece is performed using transmission electron microscopy (TEM), the dry film thickness of the first resin layer is measured at 10 points and an average value found, and an estimated value $T_2$ (I) of the average value of the dry film thickness of the second resin layer is found. For the sample piece, an evaluation is made of the reflectance spectrum of 200 measurement points, each measurement spot having a diameter of φ40 μm, spaced at 0.2 mm intervals on a straight line (namely, a 4 cm long line) in a freely selected direction using a reflective film thickness monitor FE-3000, with this repeated for 5 rows disposed at 1 cm intervals in a direction orthogonal to the direction of the straight line described above, giving a total of 1,000 points. When this is performed, in order to take into consideration reflection at the interface between the first resin layer and the temporary support body and the interface between the second resin layer and the first resin layer, the refractive indexes n1 of the second resin layer and the dry film thicknesses of the second resin layer and the first resin layer at the 1,000 measurement points are found from the reflectance spectrum of the third laminated body by using a simulation calculate to perform fitting in a state in which the value of the refractive indexes $n_0$ found by (1) above, the refractive indexes $n_1$ found by (2) above, the second estimated value $T_1$ (II), and the first estimated value $T_1$ (I) have been substituted into a calculation equation. The average values, maximum values, minimum values, and standard deviations of the dry film thicknesses of the second resin layer and the first resin layer are also computed to find $n_1$, $n_2$, $T_1$, $T_2$, $\sigma_2$, and $H_2$. Note that $n_2$ denotes the refractive index of the second resin layer, $n_1$ denotes the refractive index of the first resin layer, $T_2$ denotes the average dry film thickness of the second resin layer, $T_1$ denotes the average dry film thickness of the first resin layer, $\sigma_2$ denotes the standard deviation of the dry film thickness of the second resin layer, and $H_2$ denotes the difference between the maximum value and minimum value of the dry film thickness of the second resin layer.

The precision of the fit of the simulation can be increased by inputting, into the reflective film thickness monitor, the estimated values obtained for the dry film thickness of the second resin layer and the dry film thickness of the first resin layer by carrying out structural analysis using TEM.

—Viscosity—

The viscosity of the first resin layer and the second resin layer measured at 100° C. is preferably in a range of from 2,000 Pa·sec to 50,000 Pa·sec.

Here, the viscosity can be measured as follows. The temporary support body is peeled away from the first resin layer and the second resin layer, initial melting is caused on a heated stage at 85° C., and a specimen is formed by then cooling to room temperature. The measurement can be made using a melt viscometer (product name: DHR-2, manufactured by TA Instruments Japan Inc.) under the following conditions. The measurement conditions are temperature: from 40° C. to 140° C., heating rate: 5° C./min, frequency: 1 Hz, and strain: 0.5%.

—Hardness—

The first resin layer is preferably a curable resin, and is more preferably a film that is somewhat soft before curing. It is particularly preferable to include at least one kind selected from organic macromolecular substances having a softening point of 80° C. or less according to the Vicat method (more specifically, a polymer softening point measuring method that uses the American Standards for Testing and Materials (ASTM) D1235).

A freely selected polymer component or a freely selected polymerizable compound component may be employed as the material of the first resin layer with no particular limitations; however, from the viewpoint of employment as a transparent protective film of a capacitance-type input device, the surface hardness after curing and the heat tolerance of the material of the first resin layer are preferably high, and amongst alkali soluble resins and polymerizable compounds included in the first resin layer, a known photosensitive siloxane resin material, an acrylic resin material, or the like is preferably employed.

<Second Resin Layer>

The second resin layer of the present disclosure may lack curability, may be thermocurable, may be photocurable, or may be both thermocurable and photocurable.

From the viewpoint of the physical durability of the cured film after curing, the second resin layer is preferably photocurable and/or thermocurable.

Of these, the second resin layer is preferably a transparent resin layer having at least thermocurability, from the viewpoint of being able to contribute to the reliability of the film by curing with heat after transfer, and is more preferably a thermocurable transparent resin layer that is also a photocurable transparent resin layer from the viewpoint of facilitating film formation by photocuring after transfer, and from the viewpoint of being able to contribute to the reliability of the film by thermocuring with heat after film formation.

Moreover, from the viewpoint of protecting the electrode pattern that includes metal in at least part of the electrode pattern, the second resin layer employed in the present disclosure is preferably positioned above the transfer material of the present disclosure as an outermost layer, except for any protective film, described below, or refractive index adjusting layer formed if necessary.

The second resin layer of the present disclosure includes a water soluble polymer and a compound that has a heteroaromatic ring including a nitrogen atom as a ring member. The content of the water soluble polymer is preferably from 2% by mass to 95% by mass with respect to the total solid content of the second resin layer, and the content of the compound that has a heteroaromatic ring including a nitrogen atom as a ring member is preferably 3.0% by mass or greater with respect to the total solid content of the second resin layer.

The content of any metal oxide particles in the second resin layer is preferably less than 20% by mass, is more preferably less than 10% by mass, is still more preferably less than 5% by mass, is particularly preferably less than 1% by mass, with respect to the total solid content of the second resin layer, and it is most preferable that metal oxide particles are not included.

Moreover, it is more preferable that the second resin layer further includes a water soluble monomer and a water soluble polymerization initiator, and the second resin layer may further include a resin derived from a polymer latex, and other additives.

[Water Soluble Polymer]

The second resin layer includes a water soluble polymer. A polymer that is soluble in a water-based solvent, described below, may be employed as the water soluble polymer.

The expression "water soluble" in the present disclosure means that dissolution to 0.1% by mass or greater occurs in 25° C. distilled water. The water soluble polymer more preferably dissolves to 1% by mass or greater, and particularly preferably dissolves to 3.0% by mass or greater, in 25° C. distilled water.

The water soluble polymer is not particularly limited as long as it does not conflict with the spirit of the present disclosure, and may be appropriately selected from the known substances below.

Examples thereof include the acrylic polymer that includes an acid group described above, a polyvinylether/maleic anhydride polymer described in JP-A No. S46-2121 or JP-B No. S56-40824, water soluble salts of carboxyalkyl cellulose, water soluble cellulose ethers, water soluble salts of carboxyalkyl starch, polyvinyl alcohol derivatives such as a polyvinyl alcohol, a water soluble polyvinyl butyral, or a water soluble polyvinyl acetal, polyvinylpyrrolidone, various polyacrylamides, various water soluble polyamides, water soluble salts of polyacrylic acid, gelatin, ethylene oxide polymers, various starches and water soluble salts of the group consisting of analogs of the various starches, styrene/maleic acid copolymers, and maleinate resins.

The water soluble polymer is preferably the acrylate polymer that includes an acid group or a polyvinyl alcohol derivative, and more specifically, is particularly preferably the acrylate polymer that includes an acid group, a polyvinyl butyral, a polyvinyl acetal, a completely saponified polyvinyl alcohol, or a polyvinyl alcohol in which polyvinyl acetate has been partially saponified.

The content of the water soluble polymer in the second resin layer is from 2% by mass to 95% by mass, is preferably from 5% by mass to 90% by mass, is more preferably from 10% by mass to 80% by mass, is still more preferably from 15% by mass to 70% by mass, and is particularly preferably from 20% by mass to 60% by mass, with respect to the total solid content of the second resin layer.

[Compound that has a Heteroaromatic Ring Including a Nitrogen Atom as a Ring Member]

The second resin layer includes a compound that has a heteroaromatic ring including a nitrogen atom as a ring member.

The aromatic ring that includes a nitrogen atom is preferably at least one ring selected from the group consisting of an imidazole ring, a triazole ring, a tetrazole ring, a thiadiazole ring, and a fused ring of any of these rings and another aromatic ring. The aromatic ring that includes a nitrogen atom is more preferably an imidazole ring, a triazole ring, a fused ring of an imidazole ring and another aromatic ring, or a fused ring of a triazole ring and another aromatic ring. The aromatic ring that includes a nitrogen atom is still more preferably an imidazole ring, or a fused ring of an imidazole ring and another aromatic ring.

The other aromatic ring may be a hydrocarbon ring or a heterocycle, is preferably a hydrocarbon ring, is more preferably a benzene ring or a naphthalene ring, and is still more preferably a benzene ring.

The compound that has a heteroaromatic ring including a nitrogen atom as a ring member is preferably a heteroaromatic ring compound that includes two or more nitrogen atoms in the molecule and that has a fused ring structure, and is more preferably a heteroaromatic ring compound that includes three or more nitrogen atoms in the molecule and that has a fused ring structure. Here, the expression "two or more nitrogen atoms" or the expression "three or more nitrogen atoms" are preferably atoms included in the fused rings, and it is preferable that this heteroaromatic ring compound is a benzimidazole compound, a benzotriazole compound, or a tetrazole compound, and a benzotriazole compound is particularly preferable.

Note that in the present disclosure, compounds having a benzimidazole structure are referred to as benzimidazole compounds, compounds having a benzotriazole structure are referred to as benzotriazole compounds, and compounds having a tetrazole structure are referred to as tetrazole compounds.

The second resin layer of the present disclosure may employ two or more kinds of the specific compound in combination, preferably employs a combination of a benzimidazole compound with a benzotriazole compound, tetrazole, or mercaptothiadiazole, and more preferably employs a combination of a benzimidazole compound with a benzotriazole compound.

The benzimidazole compound is not particularly limited as long as the compound has a benzimidazole structure, and examples thereof include benzimidazole, 2-phenylbenzimidazole, 2-tolylbenzimidazole, 2-phenyl-5-chlorobenzimidazole, 2-methylbenzimidazole, 2-ethylbenzimidazole, 2-propylbenzimidazole, 2-(2'-ethylpropyl)benzimidazole, 2-(phenylmethyl)benzimidazole, 2-(diphenylmethyl)benzimidazole, 2-diphenylmethyl-5-methylbenzimidazole, 2-(naphthylmethyl)benzimidazole, 2-naphthylmethyl-5-chlorobenzimidazole, 2-thienylbenzimidazole, 2-mercaptobenzimidazole, 2-mercapto-5-methoxybenzimidazole, 2-mercapto-5-carboxybenzimidazole, 2-mercapto-5-methylbenzimidazole, 2-hydroxybenzimidazole, 2-bromobenzimidazole, 2-mercapto-5-nitrobenzimidazole, and 2-mercapto-5-aminobenzimidazole.

The benzotriazole compound is not particularly limited as long as the compound has a benzotriazole structure; however, the benzotriazole compound preferably has the structure represented by Formula (A) below, from the viewpoint of obtaining superior corrosion inhibiting effects.

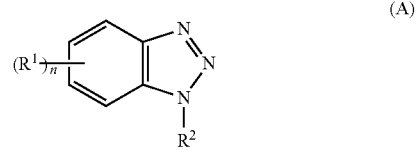

In Formula (A), each $R^1$ independently represents a substituent such as hydrogen atom, an alkyl group having from 1 to 6 carbons, an alkoxy group having from 1 to 6 carbons, an aryl group having from 6 to 14 carbons, a group represented by Formula (B) below, a mercapto group, or an alkoxycarbonyl group having from 1 to 6 carbons; n is an integer from 0 to 4, and the n units of $R^1$ may be the same as one another, or may be different from one another in cases in which n is 2 or greater; and $R^2$ represents a substituent such as a hydrogen atom, an alkyl group having from 1 to 12 carbons, an alkoxy group having from 1 to 12 carbons, an aryl group having from 6 to 14 carbons, a group represented by Formula (B) below, a mercapto group, or an alkoxycarbonyl group having from 1 to 12 carbons.

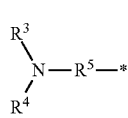

(B)

In Formula (B), $R^3$ and $R^4$ each independently represent a hydrogen atom or an alkyl group having from 1 to 10 carbons; $R^5$ represents a single bond or an alkylene group having from 1 to 6 carbons; the "*" represents a location of a bond to another structure.

Examples of the benzotriazole compound include benzotriazole, 1-[N,N-bis(hydroxyethyl)aminoethyl]benzotriazole, 1-(1,2-dicarboxyethyl)benzotriazole, tolyltriazole, 1-[N,N-bis(2-ethylhexyl)aminomethyl]benzotriazole, 1-[N,N-bis(2-ethylhexyl)aminomethyl]methylbenzotriazole, 2,2'-{[(methyl-1H-benzotriazole-1-yl)methyl]imino} bisethanol, and carboxybenzotriazole.

Examples of the tetrazole compound include tetrazole, 5-aminotetrazole and 1H-tetrazole-5-acetic acid.

Of the examples above, preferable examples of the specific compound include imidazole, benzimidazole, mercaptothiadiazole, 1,2,3-triazole, 1,2,4-triazole, benzotriazole, 1-[N,N-bis(hydroxyethyl)aminoethyl]benzotriazole, 1-(1,2-dicarboxyethyl)benzotriazole, tolyltriazole, 1-[N,N-bis(2-ethylhexyl)aminomethyl]benzotriazole, 1-[N,N-bis(2-ethylhexyl)aminomethyl]methylbenzotriazole, 2,2'-{[(methyl-1H-benzotriazole-1-yl)methyl]imino}bisethanol, carboxybenzotriazole, tetrazole, 5-aminotetrazole, and 1H-tetrazole-5-acetic acid. More preferable examples thereof include imidazole, benzimidazole, benzotriazole, 1-[N,N-bis(2-ethylhexyl)aminomethyl]benzotriazole, 1-[N,N-bis(2-ethylhexyl)aminomethyl]methylbenzotriazole, and carboxybenzotriazole. Still more preferable examples thereof include benzimidazole, benzotriazole, 1-[N,N-bis(2-ethylhexyl)aminomethyl]benzotriazole, 1-[N,N-bis(2-ethylhexyl)aminomethyl]methylbenzotriazole, and carboxybenzotriazole. Particularly preferable examples thereof include benzimidazole or benzotriazole.

The content of the specific compound is 3.0% by mass or greater, is more preferably from 3.0% by mass to 20.0% by mass, is still more preferably from 6.0% by mass to 20.0% by mass, and is particularly preferably from 11.0% by mass to 20.0% by mass, with respect to the total solid content of the second resin layer employed in the present disclosure.

In cases in which plural kinds of the specific compound are included, the total content thereof is preferably within the above ranges.

[Metal Oxide Particles]

In the present disclosure, metal oxide particles refer to metal oxide particles having a higher refractive index than the refractive index of a layer that is made from materials not including metal oxide particles.

From the viewpoint of optical characteristics, the content of the metal oxide particles is preferably from 0% by mass to 5% by mass, is more preferably from 0% by mass to 2.5% by mass, and is most preferably 0% by mass, with respect to the total mass of the second resin layer.

More specifically, the content of particles having a refractive index of 1.70 or greater to light having a wavelength of from 400 nm to 750 nm in the second resin layer is preferably less than 20% by mass, is more preferably less than 10% by mass, is still more preferably less than 5% by mass, is particularly preferably less than 1% by mass, with respect to the total solid content of the second resin layer, and such particles are most preferably not included.

The content of particles having a refractive index of 1.50 or greater to light having a wavelength of from 400 nm to 750 nm in the first resin layer is preferably less than 20% by mass, is more preferably less than 10% by mass, is still more preferably less than 5% by mass, is particularly preferably less than 1% by mass, with respect to the total solid content of the first resin layer and such particles are most preferably not included.

Here, a refractive index of 1.70 or greater to light having a wavelength of from 400 nm to 750 nm means that the average refractive index to light having a wavelength within this range is 1.70 or greater, and the refractive index is not necessarily 1.70 or greater to all light having a wavelength within this range. Similarly, a refractive index of 1.50 or greater to light having a wavelength of from 400 nm to 750 nm means that the average refractive index to light having a wavelength within this range is 1.50 or greater, and the refractive index is not necessarily 1.50 or greater to all light having a wavelength within this range. Moreover, the average refractive index is a value obtained by summing the respectively measured values of the refractive index for light having wavelengths within the above range, and dividing by the number of measurement points.

Note that the "metal" of metal oxide particles also encompasses metalloids such as B, Si, Ge, As, Sb, or Te.

Examples of optically transmissive metal oxide particles having a high refractive index include oxide particles that include an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, or Te. Such metal oxide particles encompass substances in which a surface has been treated with an organic material to enhance dispersion stability.

From the viewpoint of transparency of the first resin layer and the second resin layer, the average primary particle diameter of the metal oxide particles is preferably from 1 nm to 200 nm, and is particularly preferably from 3 nm to 80 nm, in cases in which metal oxide particles are included in these resin layers. Here, the average primary particle diameter of the particles refers to the arithmetic mean of particle diameters measured for freely selected 200 particles using an electron microscope. In cases in which the particles do not have a spherical shape, the largest diameter out of the outer diameters of the particles is taken as the particle diameter.

[Water Soluble Monomer]

The second resin layer preferably includes a water soluble monomer. A monomer that is soluble in the water-based solvent described below may be employed as the water soluble monomer.

The water soluble monomer preferably dissolves in 25° C. distilled water at 1% by mass or greater, and more preferably dissolves in 25° C. distilled water at 3.0% by mass or greater.

Examples of the water soluble monomer other than the polymerizable compound described above include monomers having a hydroxy group, monomers that include ethylene oxide or polypropylene oxide in the molecule, and monomers having a phosphoric acid group.

Examples of the monomer having a hydroxy group include monomer hydroxy ethyl(meth)acrylate, hydroxy butyl(meth)acrylate, glycerin mono(meth)acrylate, polyethylene glycol mono(meth)acrylate, and polypropylene glycol mono(meth)acrylate.

Examples of monomers that include ethylene oxide or polypropylene oxide in the molecule include ethylene oxide-modified (referred to as "EO-modified" hereafter) (meth) acrylate compounds such as a tri(meth)acrylate of EO-modified trimethylolpropane or a tri(meth)acrylate of EO-modified isocyanuric acid.

Examples of the monomers having a phosphoric acid group include vinylphosphonic acid, vinyl phosphate, acid (phosphoxy)ethyl(meth)acrylate, acid(phosphooxy)propyl (meth)acrylate, bis(methacryloxyethyl)phosphate, diphenyl-2-methacryloyloxyethyl phosphate, diphenyl-2-acryloyloxyethyl phosphate, dibutyl-2-methacryloyloxyethyl phosphate, dibutyl-2-acryloyloxyethyl phosphate, and dioctyl-2-(meth) acryloyloxyethyl phosphate.

The water soluble monomer may be employed singly, or in a combination of two or more kinds thereof.

The content of the water soluble monomer in the second resin layer is preferably from 0.1% by mass to 30% by mass, is more preferably from 0.5% by mass to 20% by mass, and is still more preferably from 1% by mass to 15% by mass, with respect to the total solid content of the second resin layer.

[Water Soluble Polymerization Initiator]

The second resin layer may include a water soluble polymerization initiator. A polymerization initiator that is soluble in the water-based solvent described below may be employed as the water soluble polymerization initiator.

The water soluble polymerization initiator preferably dissolves in 25° C. distilled water in a content of 1% by mass or greater, and more preferably dissolves in 25° C. distilled water in a content of 3.0% by mass or greater.

In the present disclosure, as described below, the dry film thickness of the second resin layer is preferably sufficiently thinner than the dry film thickness of the first resin layer. Even in cases in which the second resin layer does not include the water soluble polymerization initiator, it is expected that the polymerization of the water soluble monomers will be promoted by light and/or heat due to the polymerization initiator being included in the first resin layer.

The water soluble polymerization initiator employed in the second resin layer is preferably a photopolymerization initiator and is more preferably a photo-radical polymerization initiator.

Preferable examples of the water soluble polymerization initiator include IRGACURE 2959 (manufactured by BASF SE) or the polymerization initiator represented by Formula (2) below.

Formula (2)

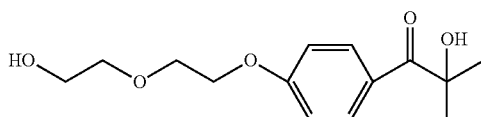

The content of the water soluble polymerization initiator in the second resin layer is preferably from 0.1% by mass to 30% by mass, is more preferably from 0.5% by mass to 20% by mass, and is still more preferably from 1% by mass to 15% by mass, with respect to the total solid content of the second resin layer.

[Polymer Latex]

The second resin layer may include polymer particles derived from a polymer latex. The polymer latex mentioned here is a substance dispersed in water as water-insoluble fine polymer particles. Polymer latexes are described in, for example, Soichi Muroi, "Chemistry of Polymer Latex" (published by The Society of Polymer Science (1973)).

Of the polymer particles that may be employed, polymer particles formed using an acrylic-based, vinyl acetate-based, rubber-based (for example, styrene-butadiene-based, or chloroprene-based), olefin-based, polyester-based, polyurethane-based, or polystyrene-based polymer, or the like, or a copolymer of these polymers, is preferable. The strength of inter-chain bonds between the polymers that form the polymer particles is preferably high. Means of strengthening the inter-polymer chain bonds include a method in which hydrogen bond interactions are used and covalent bonds are generated. The means of providing hydrogen bond strength is preferably introduction of monomers having a polar group by copolymerization with or graft polymerization onto the polymer chains. Examples of the polar group include carboxy groups (included in acrylic acid, methacrylic acid, itaconic acid, fumaric acid, maleic acid, crotonic acid, partially esterified maleic acid, and the like), primary, secondary, and tertiary amino groups, ammonium salt groups, and sulfonic acid groups (styrene sulfonic acid groups), and carboxy groups or sulfonic acid groups are particularly preferable. The copolymerization ratio for these monomers having a polar group is preferably in a range of from 5% by mass to 35% by mass, is more preferably in a range of from 5% by mass to 20% by mass, and is still more preferably in a range of from 15% by mass to 20% by mass, with respect to 100% of the polymer mass. Examples of means of generating covalent bonds include a method in which a hydroxy group, a carboxy group, a primary amino group, a secondary amino group, an acetoacetyl group, a sulfonic acid group, or the like is caused to react with an epoxy compound, a blocked isocyanate, an isocyanate, a vinylsulfone compound, an aldehyde compound, a methylol compound, a carboxylic acid anhydride, or the like.

Of the polymers employed in these reactions, polyurethane derivatives obtained by a reaction between a polyol and a polyisocyanate compound are preferable, the use of a polyvalent amine therewith as a chain lengthening agent is more preferable, and the introduction of the polar group to the polymer chain to yield an ionomer form is particularly preferable.

The weight average molecular weight of the polymers is preferably 10,000 or greater, and is more preferably from 20,000 to 100,000. Examples of the polymer, suitable for the present disclosure, include ethylene ionomers that are copolymers of ethylene and methacrylic acid, or polyurethane ionomers.

Polymer latexes employable in the present disclosure may be obtained by emulsion polymerization, or may be obtained by emulsification. A method for preparing these polymer latexes is described in, for example, "Emulsion—Latex Handbook" (edited by the Emulsion—Latex Handbook Editing Committee, published by Taiseisha Ltd. (1975)). Examples of the polymer latex that can be employed in the present disclosure include an aqueous dispersion of a polyethylene ionomer (trade name: CHEMIPEARL S120, manufactured by Mitsui Chemicals, Inc.; solid content: 27%), (trade name: CHEMIPEARL S100, manufactured by Mitsui Chemicals, Inc.; solid content: 27%), (trade name: CHEMIPEARL S111, manufactured by Mitsui Chemicals, Inc.; solid content: 27%), (trade name: CHEMIPEARL S200, manufactured by Mitsui Chemicals, Inc.; solid content: 27%), (trade name: CHEMIPEARL S300, manufactured by Mitsui Chemicals, Inc.; solid content: 35%), (trade name: CHEMIPEARL S650, manufactured by Mitsui Chemicals, Inc.; solid content: 27%), (trade name: CHEMIPEARL S75N, manufactured by Mitsui Chemicals, Inc.; solid content: 24%), or an aqueous dispersion of a polyether-based polyurethane (trade name: HYDRAN WLS-201, manufactured by DIC Corporation; solid content: 35%, glass transition temperature (Tg) 50° C.), (trade name: HYDRAN WLS-202, manufactured by DIC Corporation; solid content: 35%, Tg 50° C.), (trade name: HYDRAN WLS-221, manufactured by DIC Corporation; solid content: 35%, Tg 30° C.), (trade name: HYDRAN WLS-210, manufactured by DIC Corporation; solid content: 35%, Tg 15° C.), (trade name: HYDRAN WLS-213, manufactured by DIC Corporation; solid content: 35%, Tg 15° C.), (trade name: HYDRAN WLI-602, manufactured by DIC Corporation; solid content: 39.5%, Tg 50° C.), (trade name: HYDRAN WLI-611, manufactured by DIC Corporation; solid content: 39.5%, Tg 15° C.), an alkyl acrylate copolymer ammonium (trade name: JURYMER AT-210, manufactured by Nihon Junyaku Co., Ltd.), an alkyl acrylate copolymer ammonium (trade name: JURYMER ET-410, Nihon Junyaku Co., Ltd.), an alkyl acrylate copolymer ammonium (trade name: JURYMER AT-510, Nihon Junyaku Co., Ltd.), and a polyacrylic acid (trade name: JURYMER AC-10L, manufactured by Nihon Junyaku Co., Ltd.) neutralized with ammonia and emulsified.

In cases in which the second resin layer includes a polymer latex, the content of the polymer latex in the second resin layer is preferably from 1% by mass to 90% by mass, is more preferably from 30% by mass to 85% by mass, and is still more preferably from 40% by mass to 85% by mass, with respect to the total solid content of the second resin layer.

[Water-Based Solvent]

The second resin layer may include a water-based solvent. Water, or a solvent mixture of a lower alcohol having from 1 to 3 carbon atoms and water, is preferably employed as the water-based solvent. In the transfer material of the present disclosure, the second resin layer is preferably formed by coating with water, or a solvent mixture of a lower alcohol having from 1 to 3 carbon atoms and water, and is more preferably formed by coating with a coating liquid that includes a water, or solvent mixture, containing water/alcohol having from 1 to 3 carbon atoms at a content ratio of from 10/90 to 100/0. The content ratio in the water/alcohol having from 1 to 3 carbon atoms is particularly preferably in a range of from 10/90 to 80/20, and is most preferably from 15/85 to 40/60.

In the transfer material of the present disclosure, in cases in which the second resin layer is formed above the first resin layer, a method is preferably employed in which each component to be included in the second resin layer is dissolved in or mixed with a solvent to produce a coating liquid for forming the second resin layer, and then the produced coating liquid is coated onto the temporary support body and dried.

The drying preferably removes at least some of the solvent included in the second resin layer.

More specifically, the content of the solvent in the second resin layer after drying is preferably from 0% by mass to 10% by mass, is more preferably from 0% by mass to 5% by mass, is still more preferably from 0% by mass to 2% by mass, and is particularly preferably from 0% by mass to 1% by mass, with respect to the total mass of the second resin layer, and the solvent is most preferably not included after drying.

The water-based solvent is preferably water; a solvent mixture of water and methanol; or a solvent mixture of water and ethanol, and from the viewpoint of drying and coating properties, a solvent mixture of water and methanol is preferable.

[Other Additives]

The second resin layer may employ additives. Examples of the additives mentioned above include the surfactants described in paragraph 0017 of Japanese Patent No. 4502784 and paragraphs 0060 to 0071 of JP-A No. 2009-237362, the thermal polymerization inhibitor described in paragraph 0018 of Japanese Patent No. 4502784, and the other additives described in paragraphs 0058 to 0071 of JP-A No. 2000-310706.

[Characteristics of Second Resin Layer]

—Refractive Index and Dry Film Thickness—

The second resin layer of the present disclosure preferably has a refractive index of less than 1.60, and more preferably has a refractive index of 1.55 or less. Although there are no particular limitations to the lower bound of the refractive index of the first resin layer, the refractive index of the first resin layer is preferably 1.20 or greater.

The dry film thickness of the second resin layer of the present disclosure is preferably 500 nm or less, and is more preferably 110 nm or less. The thickness of the second resin layer is still more preferably from 55 nm to 100 nm, is particularly preferably from 60 nm to 100 nm, and is most preferably from 70 nm to 100 nm.

The refractive index and the dry film thickness can be measured in accordance with the method described above.

<Protective Film>

The transfer material of the present disclosure preferably includes a protective film above and adjacent to the second resin layer.

In the transfer material, transfer is performed after the protective film adjacent to the second resin layer is peeled off, thereby placing the substrate of the transfer destination adjacent to the second resin layer during transfer.

The protective film described in paragraphs 0083 to 0087, and 0093 of JP-A No. 2006-259138 can be appropriately used.

The protective film may be formed by pressure bonding a sheet formed using the above substance onto a film formed by the second resin layer or the like.

The method of pressure bonding is not particularly limited, and a known method may be employed.

<Other Layers>

The transfer material of the present disclosure may include other layers in accordance with the objective. Examples of other layers include a hard coat layer provided between the second resin layer and the temporary support body to give the surface of the second resin layer physical durability after transfer. Since the second resin layer is preferably positioned at the outermost layer of the transfer material (except for any protective film, or refractive index adjusting layer formed if necessary) as described above, in cases in which there are other layers present, those other layers are preferably positioned at the temporary support body side of the second resin layer.

[Refractive Index Adjusting Layer]

The transfer material of the present disclosure may further include a refractive index adjusting layer. The refractive index adjusting layer is preferably included in the transfer material of the present disclosure as the outermost layer, except for the protective film.

Including the refractive index adjusting layer in the transfer material of the present disclosure enables the visibility of the transparent electrode pattern to be improved when the transfer material of the present disclosure is used to form a protective layer and/or an insulating layer on a substrate that includes a transparent electrode pattern.

The refractive index adjusting layer is preferably a transparent resin layer.

The refractive index of the refractive index adjusting layer is preferably 1.60 or greater. Although the maximum value of the refractive index of the refractive index adjusting layer is not particularly limited, the refractive index of the refractive index adjusting layer is preferably 1.78 or less in practice, and may be 1.74 or less. Employing this range of refractive indexes improves the visibility of the transparent electrodes.

The dry film thickness of the refractive index adjusting layer is preferably 500 nm or less, is more preferably 110 nm or less, is still more preferably from 55 nm to 100 nm, is particularly preferably from 60 nm to 100 nm, and is most preferably from 70 nm to 100 nm.

The refractive index adjusting layer is preferably a layer that is not water soluble.

The refractive index adjusting layer preferably includes the binder polymer, the polymerizable compound, the polymerization initiator, the solvent, and the metal oxide particles described above. The binder polymer, polymerizable compound, polymerization initiator, and solvent are respectively synonymous with the binder polymer, polymerizable compound, polymerization initiator, and solvent included in the first resin layer, and also have similar preferable embodiment.

From the viewpoint of transparency of the refractive index adjusting layer, the average primary particle diameter of the metal oxide particles is preferably from 1 nm to 200 nm, and is more preferably from 3 nm to 80 nm. Here, the average primary particle diameter of the particles refers to the arithmetic mean of particle diameters measured for 200 given particles using an electron microscope. In cases in which the shape of the particles is not a spherical shape, the greatest diameter out of the external diameters of the particle is taken as the particle diameter.

The metal oxide particles may be employed singly, or may be employed in a combination of two or more kinds thereof.

The content of the metal oxide particles in the refractive index adjusting layer may be appropriately set in consideration of the refractive index, optical transmissivity, and the like demanded by optical components obtained using the refractive index adjusting layer. However, the content of the metal oxide particles in the refractive index adjusting layer is preferably from 5% by mass to 80% by mass, is more preferably from 10% by mass to 75% by mass from the viewpoint of improving the substrate adhesiveness of the laminated body of the present disclosure, and is still more preferably from 10% by mass to 73% by mass, with respect to the total solid content of the refractive index adjusting layer.

In the transfer material of the present disclosure, the refractive index adjusting layer preferably includes at least one selected from zirconium oxide particles, niobium oxide particles, or titanium oxide particles from the viewpoint of keeping the refractive index within the above range, and more preferably includes at least one selected from zirconium oxide particles or niobium oxide particles.

The dry film thickness and the refractive index of the refractive index adjusting layer can be computed by preparing transfer material that forms the first resin layer, the second resin layer, and the refractive index adjusting layer above the temporary support body, and performing a calculation similar to that of the measurement of the dry film thickness and refractive index of the first resin layer and the second resin layer.

(Transfer Material Production Method)

The transfer material of the present disclosure can be produced based on the production method for photosensitive transfer materials described in paragraphs 0094 to 0098 of JP-A No. 2006-259138. Of such methods, the transfer material of the present disclosure is preferably produced by a transfer material production method of the present disclosure given below.

In the method of manufacturing the transfer material of the present disclosure, it is preferable that the method of manufacturing the transfer material includes a process of forming the first resin layer above the temporary support body and a process of forming the second resin layer above the first resin layer: in which the first resin layer is not water soluble; the second resin layer includes the water soluble polymer; the second resin layer includes the compound that has a heteroaromatic ring including a nitrogen atom as a ring member; and the content of the compound that has a heteroaromatic ring including a nitrogen atom as a ring member is 3.0% by mass or greater with respect to the total solid content of the second resin layer.

It is also preferable that the second resin layer is formed directly above the first resin layer in the method of manufacturing the transfer material of the present disclosure.

The first resin layer is preferably formed by coating a coating liquid that includes each component to be included in the first resin layer described above and the solvent described above.

The second resin layer is preferably formed by coating a coating liquid that includes each component to be included in the second resin layer described above and the water-based solvent described above onto the first resin layer.

According to this configuration, even when the second resin layer is stacked after the first resin layer has been stacked without performing curing, layer demarcation is excellent and the visibility of the transparent electrode pattern can be improved, and after the first resin layer and the second resin layer have been transferred from the transfer material onto the transparent electrode pattern, the desired pattern can be developed by photolithography, and this configuration is therefore preferable.

In contrast thereto, in cases in which the second resin layer is stacked onto the first resin layer in a configuration unlike the configuration above, there are issues in that the two are liable to mix, and in particular, that a transfer material may be produced in which the content ratio of the specific compound in the second resin layer with respect to the total solid content of the second resin layer is higher than the content ratio of the specific compound in the first resin layer with respect to the total solid content of the first resin layer.

Layer demarcation between the two layers is simple in cases in which the first resin layer is cured before the second resin layer is stacked thereon, due to the first resin layer already being cured in transfer materials produced in this manner; however, patterning cannot be performed by photolithography in such cases.

The method of coating the first resin layer and the second resin layer is not particularly limited, and a publically known method may be employed; however, preferable examples of coating methods include methods in which formation is performed by coating and drying using a coating device such as a spinner, a whirler, a roller coater, a curtain coater, a knife coater, a wire bar coater, or an extruder.

The method of manufacturing the transfer material of the present disclosure may include a process in which the refractive index adjusting layer is formed after the process in which the second resin layer is formed.

More specifically, in cases in which a transfer material that includes the refractive index adjusting layer is formed, it is preferable that a coating liquid, in which each component to be included in the refractive index adjusting layer has been dissolved in the solvent, is coated onto the second resin layer and dried so as to layer the refractive index adjusting layer.

(Laminated Body and Manufacturing Method Thereof)

The laminated body of the present disclosure includes the substrate, the electrode pattern that is positioned above the substrate and that includes metal in at least part of the electrode pattern (referred to as the specific electrode pattern hereafter), the second resin layer positioned above the electrode pattern, and the first resin layer positioned above the second resin layer, in which the second resin layer includes the compound that has a heteroaromatic ring having a nitrogen atom as a ring member.

The specific electrode pattern and the second resin layer are preferably adjacent to each other.

The second resin layer preferably includes the water soluble polymer, and the content of the water soluble polymer is preferably from 2% by mass to 95% by mass with respect to the total solid content of the second resin layer.

Moreover, the first resin layer is preferably not water soluble.

The laminated body of the present disclosure is preferably a laminated body produced by transferring the first resin layer and the second resin layer from the transfer material of the present disclosure onto the electrode pattern that is positioned above the substrate and that includes metal in at least part of the electrode pattern.

The specific electrode pattern employed in the present disclosure may be an electrode pattern that includes a transparent electrode pattern, and may be an electrode pattern that includes a metal electrode pattern, and is preferably an electrode pattern that includes metal in at least part of the electrode pattern, and includes a metal electrode pattern in at least a part of the electrode pattern.

Moreover, the specific electrode pattern preferably includes a metal wiring section.

In cases in which the specific electrode pattern includes the transparent electrode pattern, the specific electrode pattern is preferably an electrode pattern that includes the transparent electrode pattern and a metal wiring section.

In cases in which the specific electrode pattern includes the transparent electrode pattern, the laminated body of the present disclosure preferably further includes the refractive index adjusting layer. The refractive index adjusting layer is preferably adjacent to the transparent electrode pattern.

In cases in which the specific electrode pattern includes the metal electrode pattern described below, the specific electrode pattern is preferably an electrode pattern that includes the metal electrode pattern and a metal wiring section.

In cases in which the specific electrode pattern includes the metal electrode pattern described below, in the laminated body of the present disclosure, the second resin layer and the metal electrode pattern may be adjacent to each other but need not be adjacent to each other; however, the second resin layer and the metal electrode pattern are preferably adjacent to one another from the viewpoint of corrosion resistance of the metal electrode pattern.

It is more preferable that the first resin layer and the second resin layer are both patterned, and it is still more preferable that the first resin layer and the second resin layer are patterned in a region above the metal wiring section.

Reference to a layer being patterned means regions where the layer is present and regions where the layer is not present have been made in the in-plane direction by intentionally removing a portion of the layer, and preferable examples of the method of patterning include a method of exposing and developing via a patterning process, described below.

The laminated body of the present disclosure preferably includes the specific compound above the metal wiring section in regions where the first resin layer and the second resin layer have been removed.

According to this configuration, corrosion resistance is also improved even in the metal wiring sections in the regions where the first resin layer and the second resin layer have been removed. This is hypothesized to be because the metal in the specific electrode pattern and the specific compound form a complex, and a layer of this complex remains on the surface of the specific electrode pattern even after the second resin layer has been removed by patterning.

The improvement effect on corrosion resistance caused by this configuration is particularly easily obtained in configurations in which the second resin layer and the metal wiring section are adjacent to each other.

Figure 10:
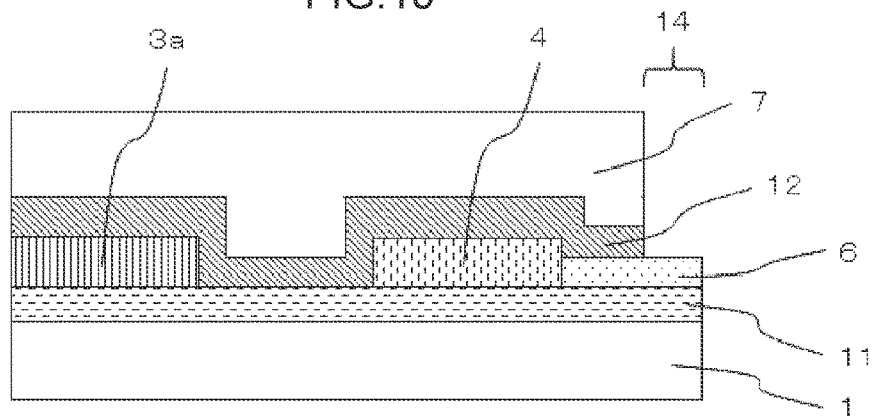
FIG. 10 is a schematic cross-section diagram illustrating another example of a laminated body of the present disclosure.

FIG. 10, which is described below, illustrates a region 14, above a metal wiring section 6, where a portion of a first resin layer 7 and a second resin layer 12 have been removed by patterning.

Figure 14:
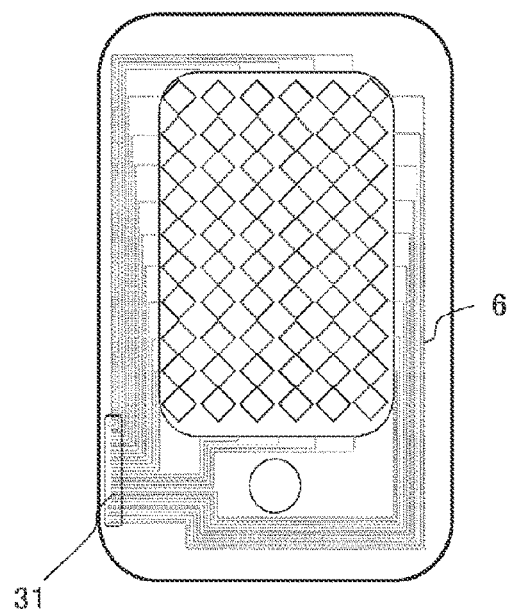
FIG. 14 is a top view illustrating another example of a configuration of a capacitance-type input device of the present disclosure, and is a schematic diagram illustrating an embodiment after patterning including a terminal portion (a terminal end portion) of layout wiring not covered by a first resin layer.

FIG. 14 illustrates a terminal portion 31 of layout wiring, which is a region where the first resin layer (and the second resin layer) have been removed by patterning, serving as a terminal portion of layout wiring. Detailed explanation regarding FIG. 14 is given below.

The following method can be employed to confirm that the specific compound is included above the metal wiring section. TRIFT II manufactured by ULVAC-PHI Inc. is used to obtain a mass spectrum by irradiating a specimen with $Au^+$ ions as the primary ion, and a neutralization gun is employed together therewith, and the generation of ions of complexes of Cu and the specific compound is confirmed. The detailed measurement conditions may be set as is appropriate. For example, the primary ion acceleration voltage may be set to 22 kV, the measurement surface area may be set to 80 μm×80 μm, and the measurement time may be set to 3 minutes.

The method of manufacturing the laminated body of the present disclosure includes a process of transferring the first resin layer and the second resin layer from the transfer material of the present disclosure onto the electrode pattern that is positioned above the substrate and that includes metal in at least part of the electrode pattern, and a process of peeling off the temporary support body.

The laminated body of the present disclosure is preferably a transparent laminated body. Moreover, the method of manufacturing the laminated body of the present disclosure is preferably a method of manufacturing the transparent laminated body.

Transparent laminated body refers to a laminated body that is at least partially transparent.

In cases in which the specific electrode pattern includes the transparent electrode pattern described below, it is preferable that the region of the portion that includes the transparent electrode pattern is transparent.

In cases in which the specific electrode pattern includes the metal electrode pattern described below, it is preferable that the region of the portion lacking the metal electrode pattern is transparent.

A laminated body in which locations other than at the electrode pattern that includes metal in at least part of the electrode pattern are transparent is preferable.

The laminated body is transparent refers to the transmittance of the laminated body being 80% or greater. The transmittance may employ the minimum value measured in a wavelength range of from 400 nm to 780 nm at a pitch of 1 nm.

Moreover, the laminated body of the present disclosure preferably has excellent colorless characteristics, namely, is not tinged yellow. The laminated body of the present disclosure preferably has excellent substrate adhesion.

Although the laminated body of the present disclosure is described below with focus on cases in which the laminated body is a transparent laminated body, the present disclosure is not limited thereto.

<Configuration of Transparent Laminated Body>

In cases in which the transparent laminated body of the present disclosure includes the transparent electrode pattern, it is preferable that a transparent film having a refractive index of from 1.60 to 1.78 and a film thickness of from 55 nm to 110 nm is further included at the side of the transparent electrode pattern opposite to the side where the second resin layer is formed, from the viewpoint of improving the visibility of the transparent electrode pattern. Note that the use of "transparent film" in the present specification refers to the "transparent film having a refractive index of from 1.60 to 1.78 and a film thickness of from 55 nm to 110 nm", unless specifically stated otherwise.

The transparent laminated body of the present disclosure preferably further includes a transparent substrate at the side of the specific electrode pattern that is opposite to the side of the second resin layer.

Moreover, in cases in which the transparent laminated body of the present disclosure includes the transparent film, a transparent substrate is preferably further included at the side of the transparent film having a refractive index of from 1.60 to 1.78 and a film thickness of from 55 nm to 110 nm that is opposite to the side where the transparent electrode pattern is formed.

The transparent substrate is preferably a transparent film substrate. In such cases, the transparent film is preferably disposed between the transparent electrode pattern and the transparent film substrate.

Moreover, in the laminated body of the present disclosure, the specific electrode pattern is preferably a specific electrode pattern formed above the transparent film substrate.

FIG. 10 illustrates one example of a configuration of a laminated body of the present disclosure. The laminated body of FIG. 10 is a transparent laminated body.

In FIG. 10, a transparent film 11 having a refractive index of from 1.60 to 1.78 and a film thickness of from 55 nm to 110 nm and a transparent substrate 1 are included, and a specific electrode pattern 4 that includes a transparent electrode pattern, a pad portion 3a described below, the metal wiring section 6, the second resin layer 12, and the first resin layer 7 are stacked in this layer configuration. The refractive index adjusting layer is preferably further included between the specific electrode pattern 4, which includes the transparent electrode pattern, and the second resin layer 12.

Although FIG. 10 illustrates a case in which the specific electrode pattern 4 includes the transparent electrode pattern, the same configuration can also be employed in cases in which the specific electrode pattern 4 is a metal electrode pattern. Note that the laminated body may lack the transparent film 11 in cases in which the specific electrode pattern 4 is a metal electrode pattern.

The second resin layer 12 and the first resin layer 7 have been removed by patterning in the region 14 of the portion above the metal wiring section 6.

Figure 12:
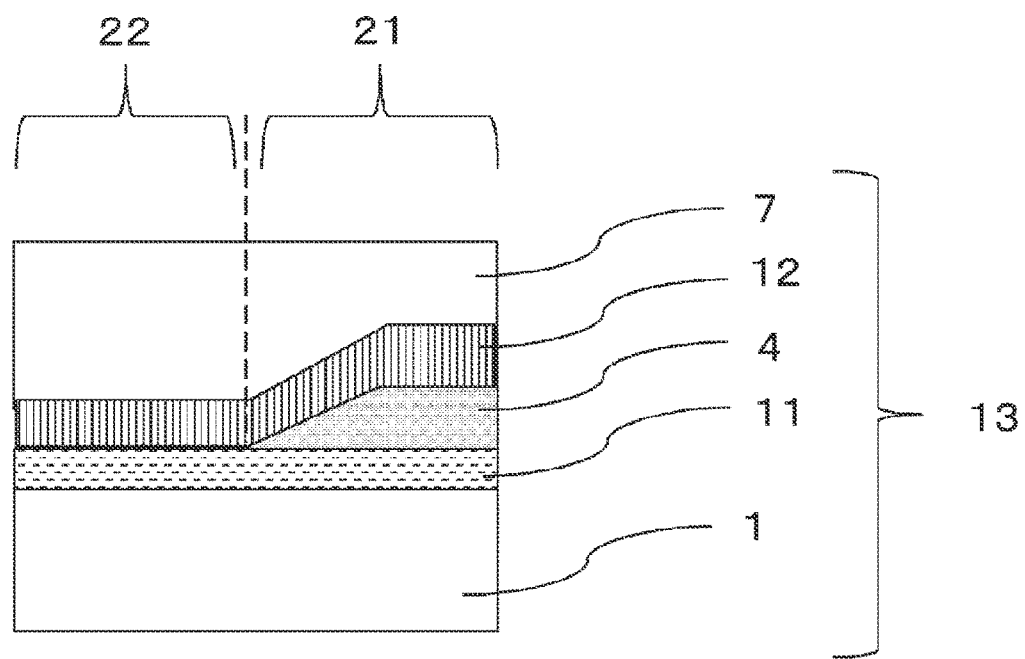
FIG. 12 is a schematic cross-section diagram illustrating an example of a configuration of a laminated body of the present disclosure.
Figure 13:
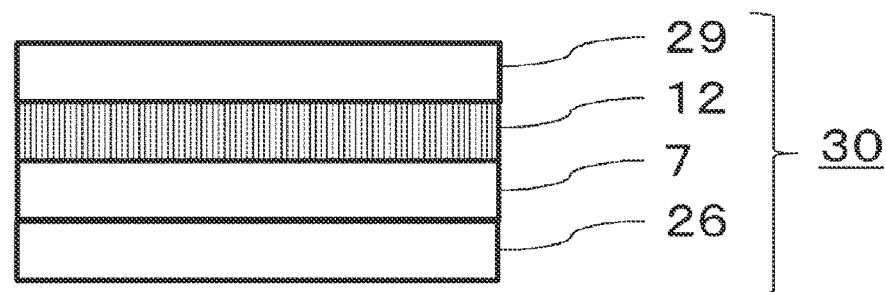
FIG. 13 is a schematic cross-section diagram illustrating an example of a configuration of a transfer material of the present disclosure.

FIG. 12 illustrates one example of a configuration of the transparent laminated body of the present disclosure.

In FIG. 12, the transparent film 11 having a refractive index of from 1.60 to 1.78 and a film thickness of from 55 nm to 110 nm and a transparent substrate 1 are included, and moreover, there is a region 21 in the plane in which the specific electrode pattern 4, the second resin layer 12, and the first resin layer 7 are further stacked thereon in this layer configuration.

In FIG. 12, the transparent film 11 need not be included in cases in which the specific electrode pattern 4 is a metal electrode pattern.

Moreover, in cases in which the specific electrode pattern 4 includes a transparent electrode pattern, the refractive index adjusting layer is preferably further included between the second resin layer 12 and the specific electrode pattern 4.

Moreover, in FIG. 12, in addition to the region mention above, the transparent laminated body also includes a region in which the transparent substrate 1, the transparent film 11, the second resin layer and the first resin layer are stacked in this layer configuration (in the configuration of FIG. 12, a region 22 in which the second resin layer 12 and the first resin layer 7 are stacked in this layer configuration (namely, an unpatterned region 22 where no specific electrode pattern is formed)).

In other words, a transparent electrode pattern-provided substrate includes a region 21 where the transparent substrate 1, the transparent film 11, the specific electrode pattern 4, the second resin layer 12, and the first resin layer 7 are stacked in this layer configuration, and the region 21 is included in an in-plane direction.

The in-plane direction refers to a direction substantially parallel to a plane parallel to the transparent substrate of the transparent laminated body. Accordingly, reference to the region where the specific electrode pattern 4, the second resin layer 12, and the first resin layer 7 are stacked in this layer configuration being included in the plane means that an orthographic projection of the region where the specific electrode pattern 4, the second resin layer 12, and the first resin layer 7 are stacked in this layer configuration, is present in a plane parallel to the transparent substrate of the transparent laminated body, in an orthographic projection onto a plane parallel to the transparent substrate of the transparent laminated body.

Here, in cases in which the transparent laminated body of the present disclosure is employed in the capacitance-type input device described below, the specific electrode pattern is provided as a first specific electrode pattern and a second specific electrode pattern in two respective directions, a row direction and a column direction, that are substantially orthogonal to each other (for example, see FIG. 4). For example, in the configuration of FIG. 4, the specific electrode pattern in the transparent laminated body of the present disclosure may be the second specific electrode pattern 4, and may be the pad portion 3a of a first specific electrode pattern 3. In other words, although the reference numeral of the specific electrode pattern is represented by "4" in the following explanation of the transparent laminated body of the present disclosure, the specific electrode pattern in the transparent laminated body of the present disclosure is not limited to being employed in the second specific electrode pattern 4 in the capacitance-type input device of the present disclosure, and may, for example, be employed as the pad portion 3a of the first specific electrode pattern 3.

The transparent laminated body of the present disclosure preferably includes an unpatterned region in which the specific electrode pattern is not formed. In the present specification, unpatterned region refers to a region where the specific electrode pattern 4 is not formed.

FIG. 12 illustrates a configuration in which the transparent laminated body of the present disclosure includes the unpatterned region 22.

In the plane of at least a portion of the unpatterned region 22 in which the specific electrode pattern is not formed, the transparent laminated body of the present disclosure preferably includes a region where the transparent substrate, the second resin layer, the first resin layer, and, if necessary, the transparent film and/or the refractive index adjusting layer, are stacked in this layer configuration.

In a region in which the transparent substrate, the transparent film, the refractive index adjusting layer, the second resin layer, and the first resin layer are stacked in this layer configuration, the transparent laminated body of the present disclosure preferably includes the transparent film and the refractive index adjusting layer adjacent to each other.

However, in regions other than the unpatterned region 22, other members may be disposed in freely selected positions as long as this does not conflict with the spirit of the present disclosure. For example, in cases in which the transparent laminated body of the present disclosure is employed in the capacitance-type input device described below, a mask layer 2, an insulating layer 5, metal wiring sections 6 that are other electrically conductive elements, and the like may be stacked.

In cases in which the transparent laminated body of the present disclosure includes the transparent film, the transparent substrate and the transparent film are preferably adjacent to each other.

FIG. 12 illustrates a configuration in which the transparent film 11 is stacked above, and adjacent to, the transparent substrate 1.

Moreover, a third transparent film may be stacked between the transparent substrate and the transparent film as long as this does not conflict with the spirit of the present disclosure. For example, a third transparent film (not illustrated in FIG. 12) having a refractive index of from 1.50 to 1.52 is preferably also included between the transparent substrate and the transparent film.

The thickness of the transparent film of the transparent laminated body of the present disclosure is preferably from 55 nm to 110 nm, is more preferably from 60 nm to 110 nm, and is still more preferably from 70 nm to 90 nm.

Here, the transparent film may be a single laminated structure, or may be a laminated structure having two or more layers. In cases in which the transparent film is a laminated structure having two or more layers, the film thickness of the transparent film refers to the total film thickness of all of the layers.

In cases in which the transparent laminated body of the present disclosure includes the transparent film, the transparent film and the transparent electrode pattern are preferably adjacent to each other.

FIG. 12 illustrates a configuration in which the specific electrode pattern 4 is stacked above, and adjacent to, a partial region of the transparent film 11.

As illustrated in FIG. 12, the shape of an end portion of the specific electrode pattern 4 is not particularly limited, and may be a tapered shaped. For example, the end portion of the specific electrode pattern 4 may have a tapered shape such that the face at the transparent substrate side is wider than the face at the side opposite to the transparent substrate.

Here, the angle of the end portion of the specific electrode pattern (also referred to as the taper angle hereafter) when the end portion of the specific electrode pattern has a tapered shape is preferably 30° or less, is more preferably from 0.1° to 15°, and is still more preferably from 0.5° to 5°.

In the present specification, examples of the method of measuring the taper angle include a method in which a micrograph is taken of the end portion of the specific electrode pattern, the tapered portion in the micrograph is approximated as a triangle, and the taper angle is found by direct measurement.

Figure 11:
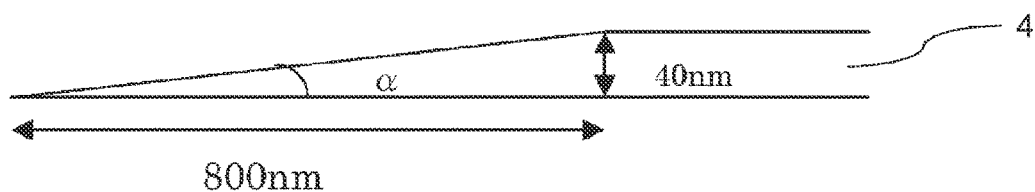
FIG. 11 is an explanatory diagram illustrating an example of a tapered shape of an end portion of a specific electrode pattern.

FIG. 11 illustrates an example of a case in which the end portion of the specific electrode pattern is a tapered shape. The triangle approximated to the taper portion in FIG. 11 has a base of 800 nm and a height (film thickness at an upper base portion substantially parallel to the base) of 40 nm, and a taper angle $\alpha$ is 3° in this case. The base of the triangle approximating the taper portion is preferably from 10 nm to 3,000 nm, is more preferably from 100 nm to 1,500 nm, and is still more preferably from 300 nm to 1,000 nm.

The preferable range of the height of the triangle approximating the taper portion is the same as the preferable range for the film thickness of the specific electrode pattern.

In cases in which the specific electrode pattern is a metal electrode pattern, the transparent laminated body of the present disclosure preferably includes a region where the specific electrode pattern and the second resin layer are adjacent to each other.

FIG. 12 illustrates a configuration in which the transparent electrode pattern, the second resin layer, and the first resin layer are adjacent to one another in the region 21 where the transparent electrode pattern, the second resin layer, and the first resin layer are stacked in this layer configuration.

In the transparent laminated body of the present disclosure, both the specific electrode pattern and the unpatterned region 22 where the specific electrode pattern is not formed are preferably covered by the first resin layer, the second resin layer, and, if necessary, the transparent film, so as to be either in direct contact or so as to have another layer interposed therebetween.

Here, "continuous" refers to the transparent film, the first resin layer, and the second resin layer being continuous films, rather than being patterned films. Namely, the transparent film, the first resin layer, and the second resin layer preferably do not have openings.

This configuration enables a transparent laminated body to be obtained in which the transparent electrode pattern not liable to be seen and the corrosion resistance of the metal wiring sections is excellent in the transparent laminated body having the transparent electrode pattern. This also enables a transparent laminated body to be obtained in which the corrosion resistance of the metal electrode is excellent in the transparent laminated body having the metal electrode pattern.

Moreover, the transparent electrode pattern and the unpatterned region 22 are more preferably covered by the transparent film, the first resin layer, and the second resin layer so as to be in direct contact, rather than being covered so as to have another layer interposed therebetween. In the case of being covered so as to have another layer interposed therebetween, examples of "another layer" include the insulating layer 5 that is included in the capacitance-type input device of the present disclosure described below, or a two-layer transparent electrode pattern in cases in which a transparent electrode pattern such as that of the capacitance-type input device of the present disclosure describe below includes two or more layers.

FIG. 12 illustrates a configuration in which the second resin layer 12 is stacked. The second resin layer 12 is stacked so as to straddle over the region where the specific electrode pattern 4 has not been stacked above the transparent film 11, and over the region where the specific electrode pattern 4 has been stacked above the transparent film 11. Namely, the second resin layer 12 is adjacent to the transparent film 11, and the second resin layer 12 is also adjacent to the specific electrode pattern 4.

Moreover, in cases in which the end portion of the specific electrode pattern 4 has a tapered shape, the second resin layer 12 is preferably stacked along the tapered shape (inclined at the same angle as the taper).

FIG. 12 illustrates a configuration in which the first resin layer 7 is stacked above the surface at the side of the second resin layer 12 opposite to the surface in contact with the transparent electrode pattern.

<Material of Transparent Laminated Body>
[Substrate]

The laminated body of the present disclosure includes a substrate.

The substrate is preferably a film substrate.

In cases in which the substrate is a film substrate, it is preferable that both faces of the film substrate respectively include the electrode pattern, the second resin layer, and the first resin layer.

The substrate is preferably a transparent substrate.

A transparent resin substrate or glass substrate may be employed as the transparent substrate.

A resin substrate is preferable from the viewpoint of manufacturability. With a resin substrate, the transfer material can be successively subjected to processes such as lamination, exposure, developing, rinsing, drying, and baking while in a roll form. A polyimide, a polycarbonate, a polyether sulfone, or a polyester is preferable, and from the viewpoint of cost, transparency, and strength, a polyimide or a polyester is more preferable.

However, from the viewpoint of heat tolerance, the transparent substrate is preferably a glass substrate.

In cases in which the specific electrode pattern is a transparent electrode pattern, the refractive index of the transparent substrate is more preferably from 1.50 to 1.52.

The transparent substrate is configured by a light transmitting substrate such as a transparent resin substrate or glass substrate, and examples of glass that may be employed include strengthened glass such as GORILLA GLASS manufactured by Corning Incorporated. Preferable examples of transparent substrates that may be employed include materials described in JP-A Nos. 2014-141592, 2010-86684, 2010-152809, and 2010-257492.

[Specific Electrode Pattern]
—Transparent Electrode Pattern—

The refractive index of the transparent electrode pattern is preferably from 1.75 to 2.10.

The material of the transparent electrode pattern is not particularly limited, and a known material may be employed therefor. For example, the transparent electrode pattern may be made from a light transmitting electrically conductive metal oxide film such as indium tin oxide (ITO) or indium zinc oxide (IZO). Examples of such metal films include ITO films, films of metals such as Al, Zn, Cu, Fe, Ni, Cr, or Mo, and metal oxide films such as $SiO_2$. In such cases, the film thickness of each element may be from 10 nm to 200 nm. Moreover, electrical resistance can be reduced by converting an amorphous ITO film to a polycrystalline ITO film by sintering. Moreover, the first specific electrode pattern 3 described above, the second specific electrode pattern 4, and the other electrically conductive elements 6 described below can be manufactured using a photosensitive film having a photocurable resin layer in which an electrically conductive fiber described below is employed. Paragraphs 0014 to 0016 of Japanese Patent Number 4506785 may be referenced in cases in which other electrically conductive patterns and the like are to be formed from ITO or the like. Of these, the transparent electrode pattern is preferably an ITO film.

The transparent electrode pattern of the transparent laminated body of the present disclosure is particularly preferably an ITO film having a refractive index of from 1.75 to 2.10.

—Metal Electrode Pattern—

Examples of the metal electrode pattern include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys of these metals. Copper, an alloy that includes copper, silver, or an alloy that includes silver is preferable. Copper or an alloy that includes copper is more preferable. Within a range that does not hinder the advantageous effects of the present disclosure, the metal electrode pattern may include resin components such as a binder, may include a photosensitive compound, and, if necessary, may further include other components.

Although not particularly limited, from the viewpoint of securing electrical reliability in the highly integrated portions and layout wiring portions (lead wiring portions) of a wiring substrate, the width of the metal wiring is preferably from 0.1 μm to 10,000 μm, is more preferably from 0.1 μm to 300 μm, is still more preferably from 0.1 μm to 100 μm, and is particularly preferably from 0.2 μm to 50 μm.

Although not particularly limited, from the viewpoint of highly integrating the wiring substrate, spacings between metal wiring are preferably from 0.1 μm to 1,000 μm, are more preferably from 0.1 μm to 300 μm, are still more preferably from 0.1 μm to 100 μm, and are particularly preferably from 0.2 μm to 50 μm.

The shape of the metal wiring is not particularly limited, and may be a freely selected shape. Examples thereof include a straight line shape, a curved line shape, a rectangular shape, and a circular shape. Moreover, plural metal wirings may be disposed in a desired pattern (for example, a stripe formation).

Although not particularly limited, from the viewpoint of highly integrating the wiring substrate, the thickness of the metal wiring is preferably from 0.001 μm to 1.0 μm, is more preferably from 0.01 μm to 0.5 μm, and is still more preferably from 0.01 μm to 0.1 μm.

[First Resin Layer and Second Resin Layer]

Preferable configurations of the first resin layer and the second resin layer included in the transparent laminated body of the present disclosure are similar to the preferable configurations of the first resin layer and the second resin layer in the transfer material of the present disclosure.

<Refractive Index and Dry Film Thickness Measuring Method of Laminated Body>

Measurement of the refractive index and the dry film thickness of the first resin layer and the second resin layer in the laminated body can be made using a reflective film thickness monitor FE-3000 (manufactured by Otsuka Electronics Co., Ltd.) in a method similar to the measurement of the refractive index and the dry film thickness in the transfer material. An outline thereof is given below. The measurement below was performed under 25° C. conditions.

In cases in which the transparent substrate is employed as the substrate, the refractive index can be measured as follows.

(1) Estimated values for the refractive index of each layer and the dry film thickness of each layer are first measured for the transparent laminated body, such as for a sample in which the transparent substrate, the transparent film, and the transparent electrode pattern are stacked in this order, and a sample in which the transparent substrate, the transparent film, the transparent electrode pattern, and the second resin layer are stacked in this order.

(2) In the transparent laminated body, a portion of the five layer configuration of the transparent substrate/transparent film/transparent electrode pattern/second resin layer/first resin layer is cut out with vertical-horizontal sides of length 10 cm×10 cm. A sample piece is prepared that places a black PET material in contact with the cut out transparent laminated body, with transparent adhesive tape (OCA tape 8171CL, manufactured by 3M Company) interposed therebetween. The sample piece is structurally analyzed using transmission electron microscopy (TEM), and estimated values of the dry film thickness for each layer are found. For the sample piece, an evaluation is made of the reflectance spectrum at 100 measurement points, spaced at 0.2 mm intervals on a straight line in a freely selected direction, using an FE-3000 (manufactured by Otsuka Electronics Co., Ltd.) with each measurement spot having a diameter of φ40 μm. When this is performed, in order to take into consideration the interface between the second resin layer and the transparent electrode pattern and the interface between the first resin layer and the second resin layer, refractive indexes $n_1$ of the first resin layer, refractive indexes $n_2$ of the second resin layer, and the dry film thicknesses of the first resin layer and the second resin layer at the 100 measurement points are found from the reflectance spectrum of a portion of the five layer configuration of the transparent substrate/transparent film/transparent electrode pattern/second resin layer/first resin layer by using a simulation calculation to perform fitting in a state in which estimated values of the average values of the refractive indexes of the second resin layer, the transparent substrate, the transparent film, and the transparent electrode pattern, and of the dry film thickness of the first resin layer, and estimated values of the average value of the dry film thickness of the second resin layer, have been substituted into the calculation equation. The average values, maximum values, minimum values, and standard deviations of the dry film thicknesses of the first resin layer and the second resin layer are also computed so as to compute $n_1$, $n_2$, $T_1$, $T_2$, $\sigma_1$, and $H_1$. In the present specification, a freely selected direction is taken as a direction parallel to an edge of the sample piece, and 100 measurement points (namely, 2 cm long) are set in respective 1 cm ranges evenly spaced about the center of the edge of the sample piece.

In cases in which a non-transparent substrate is employed, a sample piece is first prepared by bonding black PET material to the back face of the substrate, with transparent adhesive tape interposed therebetween, a reflectance spectrum (wavelengths: 430 nm to 800 nm) of a laminated body of the substrate and the black PET material is evaluated using a reflective film thickness monitor FE-3000, and refractive indexes n at each wavelength, the dry film thickness T, and an extinction coefficient k are found. In the simulation calculation for the five layer configuration sample, the refractive indexes and the dry film thicknesses of the first resin layer and the second resin layer can be found by fitting, by substituting in the refractive indexes n, the dry film thickness T, and the attenuation coefficient k as the characteristics of the substrate.

[Transparent Film]

The refractive index of the transparent film that may be included in the transparent laminated body of the present disclosure is preferably from 1.60 to 1.78, and is more preferably from 1.65 to 1.74. Here, the transparent film may be a single laminated structure, or may be a laminated structure of two or more layers. In cases in which the transparent film is a laminated structure of two or more layers, the refractive index of the transparent film refers to the refractive index of the layers overall.

The material of the transparent film is not particularly limited.

In order to achieve such a refractive index, the transparent film preferably includes the metal oxide particles.

Although not particularly limited as long as the refractive index is achievable, the content of the metal oxide particles is preferably less than 20% by mass, is more preferably less than 10% by mass, is still more preferably less than 5% by mass, and is particularly preferably less than 1% by mass, with respect to the total solid content of the transparent film, and it is most preferably that the metal oxide particles is not included.

From the viewpoint of transparency of the transparent film, the average primary particle diameter of the metal oxide particles is preferably from 1 nm to 200 nm, and is more preferably from 3 nm to 80 nm. Here, the average primary particle diameter of the particles refers to the arithmetic mean of the particle diameters measured for 200 given particles using an electron microscope. In cases in which the shape of the particles is not a spherical shape, the largest diameter out of the external diameters of the particle is taken as the particle diameter.

The metal oxide particles may be employed singly, or may be employed in a combination or two or more kinds thereof.

The content of the metal oxide particles in the transparent film may be appropriately set in consideration of the refractive index, optical transmissivity, and the like demanded by optical components obtained using the transparent film. However, the content of the metal oxide particles in the transparent film is preferably from 5% by mass to 80% by mass, is more preferably from 10% by mass to 75% by mass from the viewpoint of improving the adhesiveness of the laminated body of the present disclosure toward the substrate, and is still more preferably from 10% by mass to 73% by mass, with respect to the total solid content of the transparent film.

In the transfer material of the present disclosure, the transparent film preferably includes at least one of zirconium oxide particles, niobium oxide particles, or titanium oxide particles from the viewpoint of keeping the refractive index within the above range, and more preferably includes at least one of zirconium oxide particles or niobium oxide particles.

Preferable ranges for materials other than the metal oxide particles of the transparent film and preferable ranges for properties other than the refractive index are similar to the preferable ranges for those of the second resin layer.

In the transparent laminated body of the present disclosure, the transparent film and the second resin layer are preferably made from the same material from the viewpoint of optical homogeneity.

The transparent film of the transparent laminated body of the present disclosure is preferably a transparent resin film.

The metal oxide particles, the resin (binder), and other additives employed in the transparent resin film are not particularly limited as long as the other additives do not conflict with the spirit of the present disclosure, and the resin and other additives employed in the second resin layer in the transfer material of the present disclosure can be preferably employed in the transparent resin layer.

In the transparent laminated body of the present disclosure, the transparent film may be an inorganic film.

The inorganic films described in JP-A Nos. 2010-86684, 2010-152809, and 2010-257492, and the like can be employed as the inorganic film, and an inorganic film having a laminated structure of a low refractive index material and a high refractive index material described in these documents, or an inorganic film that is a mixture film of a low refractive index material and a high refractive index material, is preferably employed from the viewpoint of controlling the refractive index. The low refractive index material and the high refractive index material can preferably employ the materials described in JP-A Nos. 2010-86684, 2010-152809, and 2010-257492, and the contents of these documents are incorporated by reference in the present specification.

The inorganic film may be a mixed film of $SiO_2$ and $Nb_2O_5$, and in such cases, a mixed film of $SiO_2$ and $Nb_2O_5$ is more preferably formed by sputtering.

[Refractive Index Adjusting Layer]

Preferable ranges for the refractive index adjusting layer that may be included in the transparent laminated body of the present disclosure are similar to the preferable ranges for the refractive index adjusting layer in the transfer material of the present disclosure.

[Additional Transparent Film]

In cases in which the specific electrode pattern includes a transparent electrode pattern, the laminated body of the present disclosure may further include an additional transparent film.

The additional transparent film is preferably included between the substrate and the transparent film, and is more preferably included between the transparent substrate and the transparent film.

The refractive index of the additional transparent film is preferably from 1.50 to 1.55, and is more preferably from 1.50 to 1.52, from the viewpoint of improving the visibility of the transparent electrode pattern due to the refractive index of the additional transparent film being close to the refractive index of the substrate.

[Hard Coat Layer]

Instead of the transparent film described above, a hard coat layer may be introduced between the substrate and the transparent electrode pattern. The hard coat layer may be formed by a dry process such as a vacuum deposition method, a sputtering method, or an ion plating method, or by a wet method (a coating method) or the like. A coating method employing a roller coater, a reverse roller coater, a gravure coater, a micro gravure coater, a knife coater, a bar coater, a wire bar coater, a die coater, or a dip coater may be employed as the wet method (coating method).

The hard coat layer is introduced with a view to improving slidability or hardening, and is formed using, for example, a curable substance, cured using heat, ultraviolet rays (UV), or ionizing radiation, such as a reactive silicon compound such as tetraethoxysilane or a curable composition that includes a polyfunctional (meth)acrylate. Moreover, inorganic fine particles such as colloidal silica may be added, and the refractive index of the hard coat layer is preferably adjusted to from approximately 1.45 to approximately 1.55.

<Formation of Specific Electrode Pattern on Both Substrate Faces>

The specific electrode pattern may be formed on one face of the substrate alone, or may be formed on both faces. The substrate is preferably a transparent substrate, and is more preferably a transparent film substrate. In cases in which the electrode pattern is formed on both faces of the substrate, the hard coat layer and the transparent film formed between the substrate and the specific electrode pattern may be formed such that the thickness and layer configuration has symmetry between both sides, or may be formed without symmetry. In cases in which the specific electrode pattern is formed on both faces of the substrate, the first resin layer and the second resin layer included in the transfer material of the present disclosure are preferably transferred onto both faces.

Namely, the laminated body of the present disclosure preferably respectively includes the specific electrode pattern, the first resin layer, and the second resin layer on both faces of the transparent film substrate. FIG. 1, described below, illustrates a configuration that is one example of a configuration of the laminated body in such cases.

[Third Transparent Film]

The refractive index of the third transparent film is preferably from 1.50 to 1.55 from the viewpoint of improving the visibility of the transparent electrode pattern due to the refractive index being close to the refractive index of the transparent substrate, and is more preferably from 1.50 to 1.52.

<Method of Manufacturing Laminated Body>

A method of manufacturing the transparent laminated body of the present disclosure includes a process of transferring the first resin layer and the second resin layer from the transfer material of the present disclosure onto the electrode pattern that is positioned above a substrate and that includes metal in at least part of the electrode pattern, and a process of peeling away the temporary support body.

The method of manufacturing the transparent laminated body of the present disclosure preferably further includes a process of patterning the first resin layer and the second resin layer that are stacked above the electrode pattern.

Such a configuration enables the second resin layer and the first resin layer of the transparent laminated body to be transferred in unison, and enables the transparent laminated body to be produced easily with high productivity.

Note that the second resin layer in the method of manufacturing the transparent laminated body of the present disclosure is formed as a film above the specific electrode pattern and above the transparent film in the unpatterned regions, either directly or with another layer interposed therebetween.

[Process of Transferring First Resin Layer and Second Resin Layer]

The method of manufacturing the laminated body of the present disclosure includes the process of transferring the first resin layer and the second resin layer from the transfer material of the present disclosure onto the electrode pattern that is positioned above a substrate and that includes metal in at least part of the electrode pattern, above a transparent resin pattern.

The process of transferring the first resin layer and the second resin layer is a process of laminating (bonding) the first resin layer and the second resin layer of the transfer material of the present disclosure onto the transparent electrode pattern. When doing so, the protective film is removed prior to lamination in cases in which the transfer material includes the protective film described above.

Lamination of the first resin layer and the second resin layer onto the surface of the transparent electrode pattern is performed by overlaying the first resin layer and the second resin layer above the surface of the transparent electrode pattern, applying pressure, and applying heat. A known laminator such as a laminator, a vacuum laminator, or an auto-cut laminator capable of further increasing productivity may be employed in the bonding.

[Process of Peeling Off Temporary Support Body]

The method of manufacturing the laminated body of the present disclosure includes a process of peeling off the temporary support body after the process of transferring the first resin layer and the second resin layer. The method of peeling off the temporary support body is not particularly limited and a known method may be employed. In cases in which the method of manufacturing the laminated body of the present disclosure includes the process of patterning described below, the process of peeling off the temporary support body may be performed before the patterning process, or may be performed midway through the patterning process (between the exposure process and the development process).

[Process of Surface Treating Substrate]

The method of manufacturing the laminated body of the present disclosure may further include a "process of surface treating the substrate" in which, prior to the process of transferring the first resin layer and the second resin layer, surface treatment is first carried out on the non-contact face of the substrate (the transparent film substrate or a front sheet) in order to increase the adhesiveness of each layer when laminating in the process of transferring the first resin layer and the second resin layer. Surface treatment that employs a silane compound (silane coupling treatment) is preferably carried out as the surface treatment. A substance having functional groups that interact with the photosensitive resin preferably serves as the silane coupling agent. For example, a silane coupling solution (an aqueous solution of N-β-(aminoethyl)-γ-aminopropyl trimethoxysilane at 0.3% by mass, trade name: KBM603, manufactured by Shin-Etsu Chemical Co., Ltd.) may be sprayed for 20 seconds using a shower, and then washed with a purified water shower. Reactions may then be caused by heating. A heating tank may be employed, or reactions may be promoted by preheating the substrate of the laminate.

Preferable configurations of this substrate are similar to the preferable configurations of the substrate in the laminated body of the present disclosure.

[Process of Film Forming Specific Electrode Pattern]

The method of manufacturing the laminated body of the present disclosure may include a process of film forming the specific electrode pattern.

Using, for example, the method of forming the first specific electrode pattern 3, the second specific electrode pattern 4, and the metal wiring section 6 in the explanation of the capacitance-type input device of the present disclosure given below, the specific electrode pattern may be formed as a film above the substrate or above the transparent film having a refractive index of from 1.60 to 1.78 and a film thickness of from 55 nm to 110 nm, and a method that uses a photosensitive film is preferable. The process of forming the specific electrode pattern as a film is preferably performed before the process of transferring the first resin layer and the second resin layer described above.

[Process of Patterning First Resin Layer]

The method of manufacturing the laminated body of the present disclosure preferably further includes a process of patterning the first resin layer (also referred to as the patterning process hereafter).

The patterning process is preferably a process of patterning the first resin layer and the second resin layer. The patterning process includes an exposing process and a developing process.

The method described in paragraphs 0035 to 0051 of JP-A No. 2006-23696 can also be preferably employed in the present disclosure as an example of the process of exposing, the process of developing, and other processes.

If necessary, a patterning process may be performed on layers other than the first resin layer and the second resin layer.

In the laminated body prior to patterning, the corrosion resistance of the specific electrode pattern is improved even after the second resin layer has been removed by patterning, particularly in configurations in which the second resin layer and the specific electrode pattern are in direct contact with each other. This is hypothesized to be because the metal in the specific electrode pattern and the specific compound form a complex, and a layer of this complex remains on the surface of the specific electrode pattern even after the second resin layer has been removed by patterning.

The explanation that follows is an explanation of an example of a case in which the first resin layer and/or the second resin layer are patterned.

[Process of Exposing]

The process of exposing is, for example, a process of exposing the first resin layer and/or the second resin layer that have been transferred onto the transparent electrode pattern.

Specific examples include a method in which a specific mask is disposed above the first resin layer and/or the second resin layer that have been formed above the specific electrode pattern, and the first resin layer and/or the second resin layer are then exposed through the mask from above the mask, and a method in which the entire face of the first resin layer and/or the second resin layer is completely exposed without using a mask.

Here, a device that can emit light in a long wavelength region (for example, 365 nm or 405 nm) capable of curing the first resin layer and/or the second resin layer can be appropriately selected for employment as the light source for exposing. Specific examples include an ultra high pressure mercury lamp, a high pressure mercury lamp, and a metal hydride lamp. The amount of light exposure is preferably from approximately 5 mJ/cm$^2$ to approximately 200 mJ/cm$^2$, and is more preferably from approximately 10 mJ/cm$^2$ to approximately 100 mJ/cm$^2$.

The process of exposing may be performed after peeling off the temporary support body, or exposure may be performed prior to peeling off the temporary support body and the temporary support body peeled off subsequently. Exposure may be performed through the mask, or digital exposure may be performed using a laser or the like.

[Process of Developing]

The process of developing is, for example, a process of developing the first resin layer and/or second resin layer that have been exposed.

The development may be performed using development liquid. The development liquid is not particularly limited, and a known development liquid, such as that described in JP-A No. H05-72724, may be employed. The development liquid preferably exhibits a developing action that dissolves the first resin layer and the second resin layer, and for example, preferably includes a compound having a pKa of from 7 to 13 at a concentration of from 0.05 mol/L to 5 mol/L. In cases in which a pattern is not formed in the first resin layer or the second resin layer themselves (such as cases that employ etching), the development liquid preferably exhibits a developing action that does not dissolve the first resin layer and the second resin layer, and, for example, preferably includes a compound having a pKa of from 7 to 13 at a concentration of from 0.05 mol/L to 5 mol/L. A small amount of an organic solvent that is miscible in water may be further added to the developer fluid. Examples of the organic solvent that is miscible in water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the organic solvent is preferably from 0.1% by mass to 30% by mass. A known surfactant may be further added to the developer fluid. The concentration of the surfactant is preferably from 0.01% by mass to 10% by mass.

The developing procedure may be paddle development, shower development, shower & spin development, dip development, or the like. Here, in explanation regarding shower development, uncured portions can be removed by spraying the development liquid onto the first resin layer and the second resin layer using a shower after exposure. After developing, development residue is preferably removed by, for example, using a shower to spray with a rinsing agent, or rubbing with a brush or the like. The development liquid is preferably a liquid at a temperature of from 20° C. to 40° C., and the development liquid preferably has a pH of from 8 to 13.

[Other Processes]

The method of manufacturing the laminated body may include other processes such as a process of post exposure or a process of post baking. In cases in which the first resin layer and the second resin layer are thermocurable resin layers, a process of post baking is preferably performed after the process of developing.

[Process of Film Forming Transparent Film]

The method of manufacturing the laminated body of the present disclosure preferably includes a process of forming the transparent film as a film.

In the process of forming the transparent film as a film, in cases in which the transparent film having a refractive index of from 1.60 to 1.78 and a film thickness of from 55 nm to 110 nm is further included at the opposite side of the transparent electrode pattern to the side where the second resin layer is formed, the transparent film is formed as a film either directly above the transparent electrode pattern or with another layer, such as the additional transparent film, interposed therebetween.

Although the method of forming the transparent film as a film is not particularly limited, the transparent film is preferably formed as a film by transferring or sputtering.

Of these, the process of forming the transparent film as a film is preferably a process of forming the transparent film to be formed as a film by transferring a transparent curable resin film that has been formed above the temporary support body onto the substrate, and is more preferably a process of forming the transparent film to be formed as a film by curing after transferring. Examples of the method of transferring and curing include a method in which transferring, exposure, development, and other processes are performed similarly to in the method of transferring the first resin layer and the second resin layer in the method of manufacturing the laminated body of the present disclosure, using the photosensitive film in the explanation of the capacitance-type input device of the present disclosure described below. In such cases, the refractive index of the transparent film is preferably adjusted to be within the range described above by dispersing metal oxide particles in the photocurable resin layer in the photosensitive film.

However, in cases in which the transparent film is an inorganic film, the transparent film is preferably formed by sputtering. Namely, the transparent film of the laminated body of the present disclosure is preferably formed by sputtering.

The methods described in JP-A Nos. 2010-86684, 2010-152809, and 2010-257492 can be preferably employed as the sputtering method, and the contents of these documents are incorporated by reference in the present specification.

[Process of Film Forming Additional Transparent Film]

The method of manufacturing the laminated body of the present disclosure preferably includes a process of forming an additional transparent film as a film.

The process of forming the additional transparent film as a film is a process similar to the process of forming the transparent film as a film.

(Capacitance-Type Input Device and Production Method Thereof)

The capacitance-type input device of the present disclosure is manufactured using the transfer material of the present disclosure and includes the transparent laminated body of the present disclosure.

The capacitance-type input device of the present disclosure is preferably manufactured by transferring the first resin layer and the second resin layer from the transfer material of the present disclosure onto a specific electrode pattern of the capacitance-type input device.

The capacitance-type input device of the present disclosure preferably includes the first resin layer and the second resin layer which have been patterned after being transferred from the transfer material of the present disclosure. The protective film is preferably peeled off from the transfer material of the present disclosure prior to transferring the first resin layer and/or the second resin layer from the transfer material of the present disclosure. The capacitance-type input device of the present disclosure needs to be connected to another wiring member (such as a flexible printed substrate) by a terminal portion of the layout wiring, and it is therefore preferable that the terminal portion of the layout wiring is not covered by the second resin layer (or the first resin layer).

In the capacitance-type input device of the present disclosure, the first resin layer and the second resin layer transferred from the transfer material of the present disclosure are preferably simultaneously cured, and the first resin layer and the second resin layer are more preferably simultaneously cured and patterned. The temporary support body is preferably not peeled off from the transfer material of the present disclosure when simultaneously curing the first resin layer and the second resin layer transferred from the transfer material of the present disclosure.

In the capacitance-type input device of the present disclosure it is more preferable that the first resin layer and the second resin layer are transferred from the transfer material of the present disclosure and simultaneously cured, and the uncured portions thereof developed and removed. The temporary support body is preferably peeled off from the transfer material of the present disclosure after curing the first resin layer and the second resin layer transferred from the transfer material of the present disclosure, but before development. The capacitance-type input device of the present disclosure needs to be connected to flexible wiring formed on a polyimide film by the terminal portion of the layout wiring, and is therefore preferably not covered by the first resin layer or the second resin layer.

Such a configuration is illustrated in FIG. 14. FIG. 14 illustrates a capacitance-type input device that includes the layout wiring of the specific electrode pattern (another electrically conductive element 6) and the terminal portion 31 of the layout wiring, and that has the following configuration.

The first resin layer and the second resin layer form an uncured portion (an unexposed portion) above the terminal portion 31 of the layout wiring, and are therefore removed by developing, and this exposes the terminal portion 31 of the layout wiring.

Figure 15:
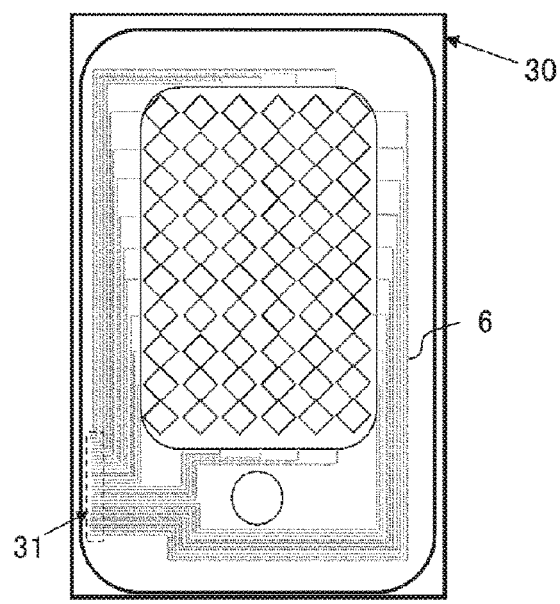
FIG. 15 is a schematic diagram illustrating one example of a state after stacking a transfer material of the present disclosure including a first resin layer and a second resin layer onto a transparent electrode pattern of a capacitance-type input device by lamination, and prior to patterning.
Figure 16:
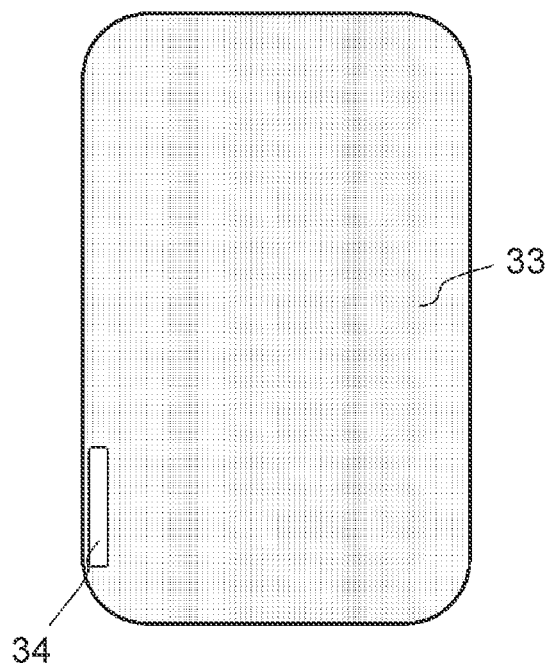
FIG. 16 is a schematic diagram illustrating an example of a desired pattern in which a first resin layer and a second resin layer have been cured.

A more specific configuration for the exposure and development is illustrated in FIG. 15 and FIG. 16. FIG. 15 illustrates a state prior to stacking a transfer material 30 of the present disclosure that includes the first resin layer and the second resin layer, onto the transparent electrode pattern of the capacitance-type input device by lamination, and being cured by exposure or the like. In cases in which photolithography is employed, namely, in cases in which curing is caused by exposure, a cured portion (exposed portion) 33 of the first resin layer and the second resin layer shaped as illustrated in FIG. 16 can be obtained by using the mask to perform pattern exposure, and developing the unexposed portion. More specifically, in FIG. 16, an opening 34 corresponding to the terminal portion of the layout wiring, and an end portion of the transfer material of the present disclosure having the first resin layer and the second resin layer protruding at the outer edge of the outline of the frame portion of the capacitance-type input device, have been removed as uncured portions of the first resin layer and the second resin layer, and a cured portion (desired pattern) of the first resin layer and the second resin layer for leaving the terminal portion (take-out wiring portion) of the layout wiring uncovered is obtained.

This enables flexible wiring prepared on a polyimide film to be directly connected to the terminal portion 31 of the layout wiring, thereby enabling sensor signals to be sent to an electrical circuit.

The capacitance-type input device of the present disclosure preferably includes the specific electrode pattern, and the first resin layer and second resin layer disposed above the specific electrode pattern.

In cases in which the specific electrode pattern is a metal electrode pattern, it is more preferable to have the second resin layer disposed adjacent to the specific electrode pattern, and the first resin layer disposed adjacent to the second resin layer.

In cases in which the specific electrode pattern includes the transparent electrode pattern, it is still more preferable to further include a refractive index adjusting layer that has a refractive index of 1.60 or greater between the second resin layer and the transparent electrode pattern.

Detailed explanation follows regarding a preferable configuration of the capacitance-type input device of the present disclosure.

The capacitance-type input device of the present disclosure includes a front sheet (corresponding to the transparent substrate in the transparent laminated body of the present disclosure) and elements (3) to (5), (7), and (8) below on at least the non-contact face side of the front sheet, and preferably includes the transparent laminated body of the present disclosure.

Plural first specific electrode patterns (3) formed extending in a first direction by connecting portions between plural pad portions.

Plural second specific electrode patterns (4) made of plural pad portions that are electrically insulated from the first specific electrode patterns, and that are formed extending along a direction intersecting with the first direction.

An insulating layer (5) that electrically insulates the first specific electrode patterns and the second specific electrode patterns.

A second resin layer (7) that is formed so as to cover all or a portion of elements (3) to (5) above.

A first resin layer (8) formed adjacent to the element (7) above, so as to cover the element (7).

Here, the second resin layer (7) corresponds to the second resin layer in the transparent laminated body of the present disclosure. Moreover, the first resin layer (8) corresponds to the first resin layer in the transparent laminated body of the present disclosure. The first resin layer is preferably what is known as a transparent protective layer in ordinary known capacitance-type input devices.

This configuration obtains a capacitance-type input device having a specific electrode pattern with excellent corrosion resistance.

In the capacitance-type input device of the present disclosure, the first specific electrode pattern (3) and the second specific electrode pattern (4) may be transparent electrode patterns or may be metal electrode patterns, but preferably at least one is a metal electrode pattern, and more preferably both are metal electrode patterns.

The capacitance-type input device of the present disclosure may further include an electrically conductive element (6) other than the first specific electrode pattern and the second specific electrode pattern, electrically connected to at least one out of the first specific electrode pattern and the second specific electrode pattern.

The other electrically conductive element is preferably a metal electrode pattern.

In cases in which either the first specific electrode pattern (3) or the second specific electrode pattern (4) in the capacitance-type input device of the present disclosure includes the transparent electrode pattern, it is preferable that a transparent film (2) is further included between the first specific electrode pattern (3) and the front sheet, between the second specific electrode pattern (4) and the front sheet, or between the other electrically conductive element (6) and the front sheet. Here, from the viewpoint of improving the visibility of the transparent electrode pattern, the transparent film (2) preferably corresponds to the transparent film having a refractive index of from 1.60 to 1.78 and a film thickness of from 55 nm to 110 nm of the laminated body of the present disclosure.

The capacitance-type input device of the present disclosure preferably further includes a mask layer and/or a decorative layer (1) if necessary. The mask layer is provided as a black frame around the periphery of a region to be touched by a finger, stylus, or the like, thereby ensuring that the layout wiring of the specific electrode pattern is not visible from the contact side, and also providing decoration. The decorative layer is provided for decoration as a frame around the periphery of a region to be touched by a finger, stylus, or the like, and, for example, it is preferable to provide a white decorative layer.

The mask layer and/or decorative layer (1) is preferably included between the transparent film (2) and the front sheet, between the first specific electrode pattern (3) and the front sheet, between the second specific electrode pattern (4) and the front sheet, or between the other electrically conductive element (6) and the front sheet. The mask layer and/or the decorative layer (1) are more preferably provided adjacent to the front sheet.

In the capacitance-type input device of the present disclosure, including the second resin layer disposed above the specific electrode pattern, and the first resin layer in this layer configuration enables the metal electrode to have excellent corrosion resistance, and the insulating layer and/or protective layer to have excellent scratch resistance, even in cases in which various members are included in this manner.

<Configuration of Capacitance-Type Input Device>

First, explanation follows regarding a preferable configuration of the capacitance-type input device of the present disclosure, along with methods of manufacturing each member configuring the device. FIG. 1 is cross-section diagram illustrating a configuration of the capacitance-type input device in which both sides of the substrate are provided with one layer each of the transparent electrode pattern, and this is an example of a preferable configuration of the laminated body or the capacitance-type input device of the present disclosure. The capacitance-type input device in FIG. 1 includes a transparent substrate (transparent film substrate) 1, and on both faces of the transparent substrate 1, transparent films 11 having refractive indexes of 1.60 to 1.78 and film thicknesses of 55 nm to 110 nm, specific electrode patterns 4, metal wiring sections 6, first resin layers 7, and second resin layers 12 are provided with symmetry to each other. The laminated body or the capacitance-type input device of the present disclosure is not limited to the configuration of FIG. 1, and a configuration in which the transparent film 11, the specific electrode pattern 4, the metal wiring section 6, the first resin layer 7, and the second resin layer 12 are provided on one face of the transparent substrate 1 alone is also preferable.

In cases in which the plural specific electrode patterns 4 are each metal electrode patterns, the transparent film 11 need not be included.

In cases in which any of the plural specific electrode patterns 4 include transparent electrode patterns, the refractive index adjusting layer is preferably included between the second resin layer 12 and the specific electrode pattern.

Figure 2:
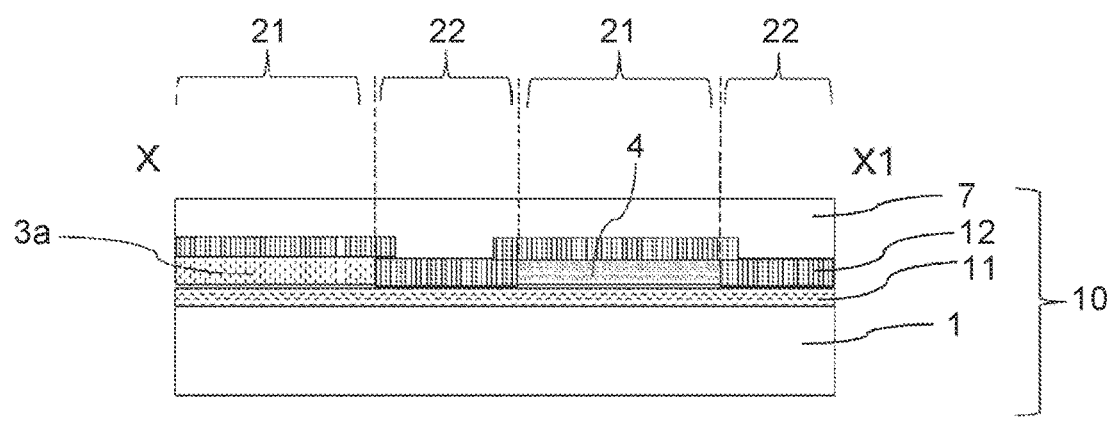
FIG. 2 is a schematic cross-section diagram illustrating another example of a configuration of a capacitance-type input device of the present disclosure.

FIG. 2 represents a cross-section taken along X-X1 in FIG. 4, described below, and is a cross-section illustrating an example of a preferable configuration of the capacitance-type input device of the present disclosure, in which the first specific electrode pattern and the second specific electrode pattern are respectively provided in two substantially orthogonal directions, a row direction and a column direction, serving as the specific electrode patterns at one side of the transparent substrate. A capacitance-type input device 10 in FIG. 2 is illustrated with a configuration that includes the transparent substrate 1, the transparent film 11 having a refractive index of 1.60 to 1.78 and a film thickness of 55 nm to 110 nm, the first specific electrode pattern 3, the second specific electrode pattern 4, the first resin layer 7, and the second resin layer 12.

Note that the transparent film 11 need not be included in cases in which either the first specific electrode pattern 3 or the second specific electrode pattern 4 is a metal electrode pattern.

In cases in which either the first specific electrode pattern 3 or the second specific electrode pattern 4 includes a transparent electrode pattern, the refractive index adjusting layer is preferably included between the second resin layer 12 and the specific electrode pattern.

The transparent substrate (front sheet) 1 may employ the transparent substrate in the substrate given as an example of the material of the transparent laminated body in the transparent laminated body of the present disclosure. In FIG. 2, the side of the front sheet 1 to which each element is provided is referred to as the non-contact face side. In the capacitance-type input device 10 of the present disclosure, input may be made by, for example, touching the contact face (the face opposite to the non-contact face) of the front sheet 1 with a finger or the like.

Figure 3:
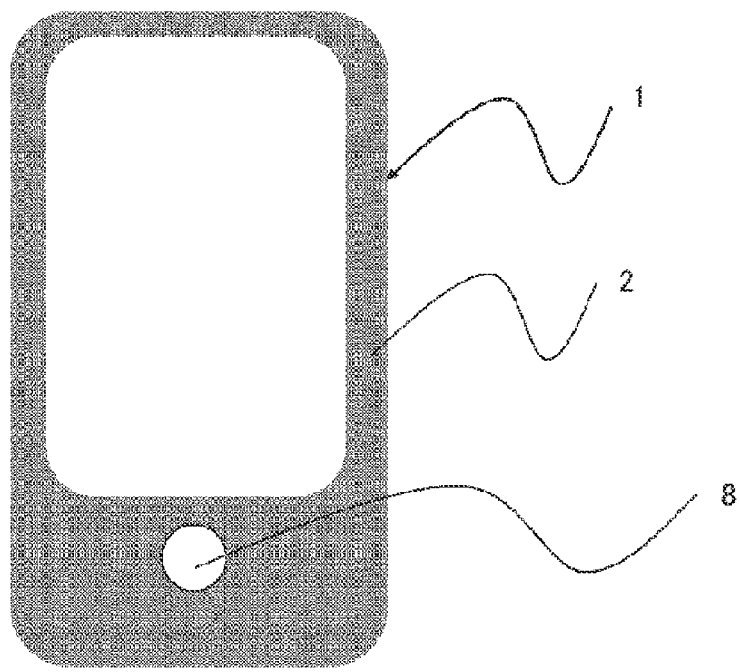
FIG. 3 is an explanatory diagram illustrating an example of a laminated body of the present disclosure.

FIG. 3 illustrates an example of a capacitance-type input device of the present disclosure that includes the mask layer. The mask layer 2 is a border shaped pattern provided at the periphery of a display region of a touch panel transparent substrate, and is formed so that the layout wiring and the like cannot be seen.

As illustrated in FIG. 3, the capacitance-type input device 10 may be provided with two mask layers such that a region in a portion of the transparent substrate 1 is covered (a region other than the input face in FIG. 3). Moreover, an opening 8 may be provided to a portion of the transparent substrate 1 as illustrated in FIG. 3. A mechanical switch operated by pressing may be disposed in the opening 8.

The metal wiring section 6 is preferably installed at the surface of the mask layer 2. The metal wiring section 6 is electrically connected to at least one of the first specific electrode pattern 3 or the second specific electrode pattern 4, and is a different element from the first specific electrode pattern 3 and the second specific electrode pattern 4.

Figure 4:
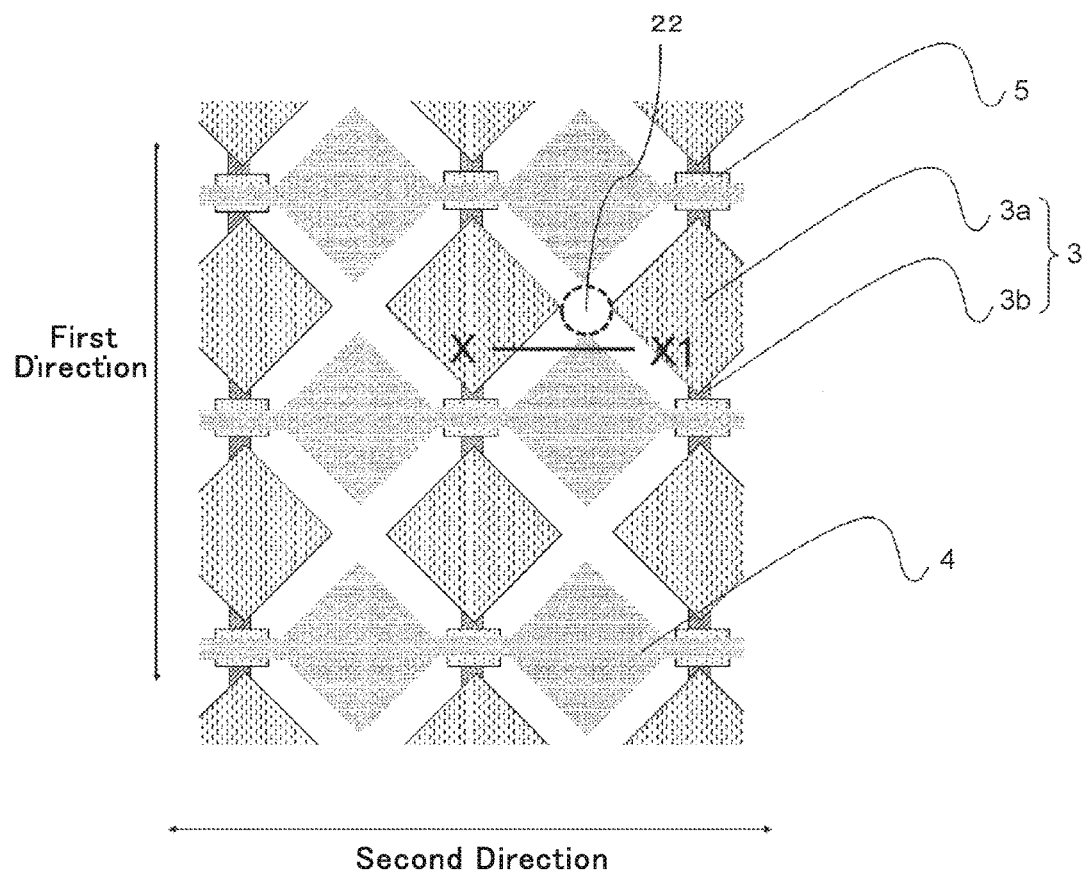
FIG. 4 is an explanatory diagram illustrating an example of a relationship between a transparent electrode pattern and an unpatterned region in the present disclosure.

FIG. 4 illustrates an example of a capacitance-type input device that includes two layers of the transparent electrode pattern at one side of the transparent substrate. Formed on the surface of the transparent substrate 1 are: plural first specific electrode patterns 3 formed from plural pad portions extending in the first direction with connecting portions interposed therebetween; plural second specific electrode patterns 4 made of plural pad portions that are electrically insulated from the first specific electrode patterns 3, and that are formed extending along a second direction intersecting with the first direction; and an insulating layer 5 that electrically insulates the first specific electrode patterns 3 from the second specific electrode patterns 4. The first specific electrode pattern 3, the second specific electrode pattern 4, and the metal wiring section 6 described below may employ the specific electrode patterns given as examples of the material of the transparent laminated body in the laminated body of the present disclosure. Preferably at least one out of the first specific electrode pattern 3 or the second specific electrode pattern 4 is a metal electrode pattern, and more preferably both the first specific electrode pattern 3 and the second specific electrode pattern 4 are metal electrode patterns.

Further explanation follows regarding the first specific electrode pattern 3 and the second specific electrode pattern 4, with reference to FIG. 4. FIG. 4 is an explanatory diagram illustrating an example of a first specific electrode pattern and a second specific electrode pattern of the present disclosure. As illustrated in FIG. 4, the first specific electrode pattern 3 is formed extending pad portions 3a in a first direction by connecting portions 3b together. The second specific electrode pattern 4 is electrically insulated from the first specific electrode pattern 3 by the insulating layer 5, and is configured by plural pad portions formed extending along a direction (the second direction in FIG. 4) intersecting with the first direction. Here, when forming the first specific electrode pattern 3, the pad portions 3a and the connecting portions 3b may be formed so as to be integrated to each other, the connecting portions 3b may be produced alone, or the pad portions 3a and the second specific electrode patterns 4 may be produced (patterned) so as to be integrated to each other. In cases in which the pad portions 3a and the second specific electrode patterns 4 are produced (patterned) so as to be integrated to each other, each layer is formed such that a portion of the connecting portions 3b and a portion of the pad portions 3a are coupled together, and the first specific electrode patterns 3 and the second specific electrode patterns 4 are electrically insulated from each other by the insulating layer 5, as illustrated in FIG. 4.

In FIG. 4, a region where the first specific electrode pattern 3, the second specific electrode pattern 4, and the metal wiring section 6, described below, are not formed corresponds to the unpatterned region 22 in the laminated body of the present disclosure.

From the viewpoint of corrosion resistance, the second resin layer 12 and the first resin layer 7 are preferably installed so as to entirely cover each configuration element. The second resin layer 12 and the first resin layer 7 may be configured so as to cover only a portion of each of the configuration elements. The insulating layer 5 and the second resin layer 12 may be the same material or may be different materials. Examples given for the materials of the first and second resin layers in the laminated body of the present disclosure can be preferably employed as a material included in the insulating layer 5.

(Method of Manufacturing Capacitance-Type Input Device)

The method of manufacturing the capacitance-type input device of the present disclosure includes a process of transferring the first resin layer and the second resin layer from the transfer material of the present disclosure onto the electrode pattern that is positioned above the substrate and that includes metal in at least part of the electrode pattern, and a process of peeling off the temporary support body.

The process of transferring the first resin layer and the second resin layer from the transfer material of the present disclosure is synonymous with the process of transferring the first resin layer and the second resin layer from the transfer material in the method of manufacturing the laminated body of the present disclosure, and preferable configurations thereof are also similar.

The method of manufacturing the image display device of the present disclosure may include a process which may be included in the method of manufacturing the laminated body of the present disclosure.

Figure 5:
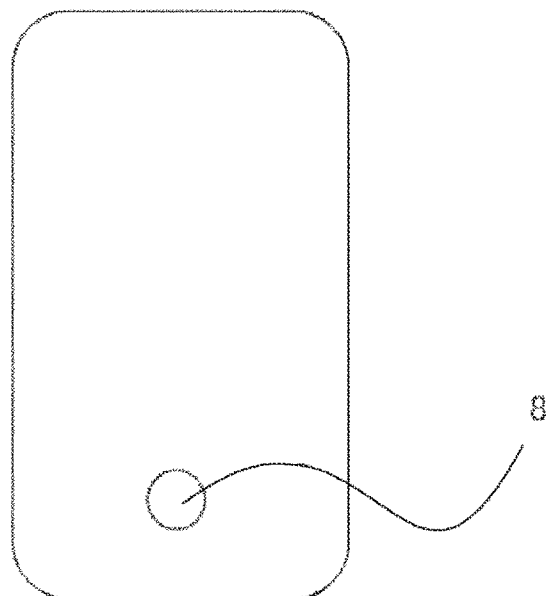
FIG. 5 is a top-face view illustrating an example of strengthened glass formed with an opening.
Figure 6:
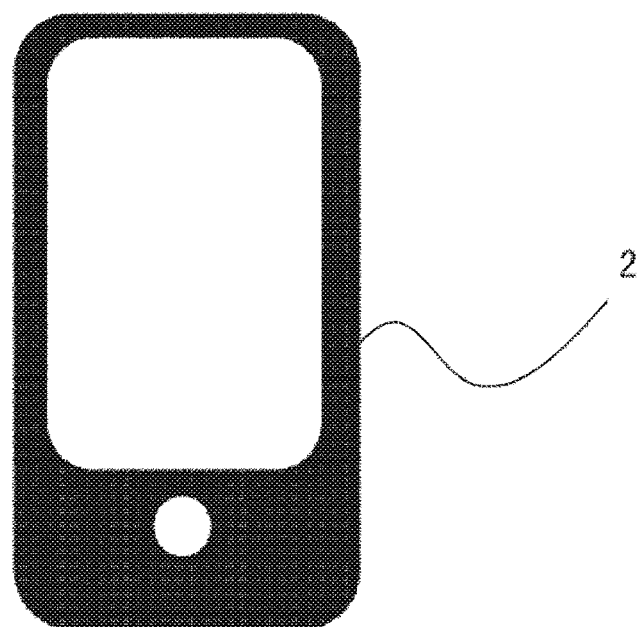
FIG. 6 is a top-face view illustrating an example of a laminated body formed with a mask layer.
Figure 7:
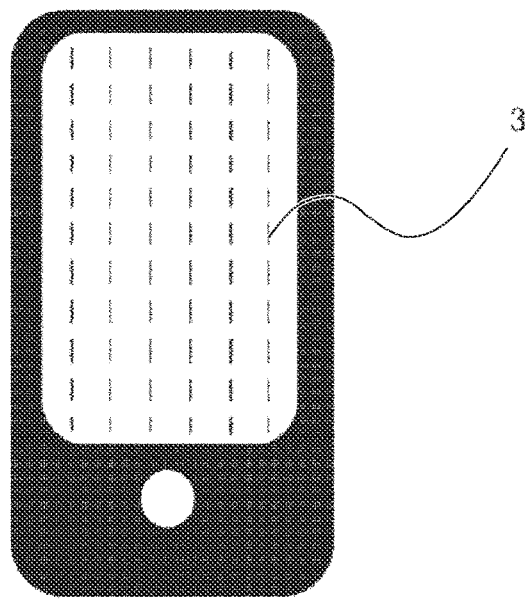
FIG. 7 is a top-face view illustrating an example of a laminated body formed with a first specific electrode pattern.
Figure 8:
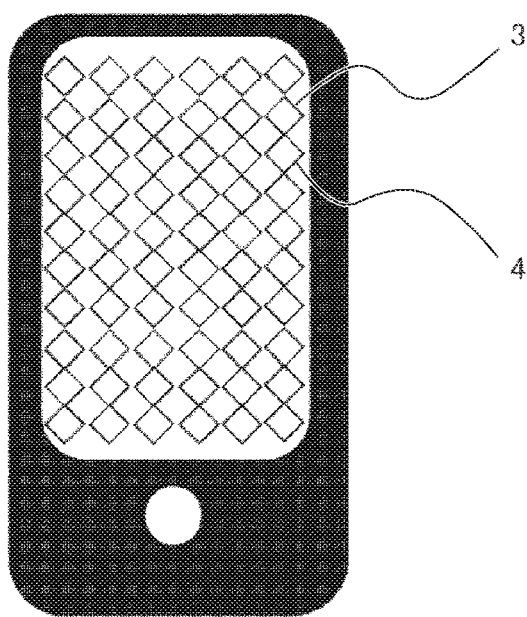
FIG. 8 is a top-face view illustrating an example of a laminated body formed with a first resin layer and a second resin layer.
Figure 9:
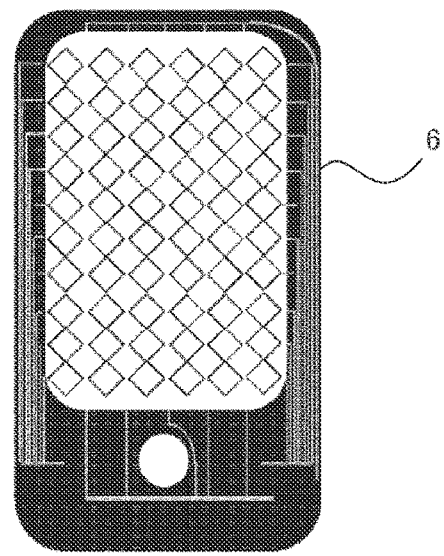
FIG. 9 is a top-face view illustrating an example of a laminated body formed with another electrically conductive element from a first specific electrode pattern and a second specific electrode pattern.

The configuration in FIG. 5 to FIG. 9 is an example of a configuration example formed by a process that produces the capacitance-type input device of the present disclosure. FIG. 5 is a top view illustrating an example of strengthened glass in which the opening 8 has been formed. FIG. 6 is a top view illustrating an example of a substrate formed with the mask layer 2. FIG. 7 is a top view illustrating an example of a substrate formed with the first specific electrode pattern 3. FIG. 8 is a top view illustrating an example of a substrate formed with the first specific electrode pattern 3 and the second specific electrode pattern 4. FIG. 9 is a top view illustrating an example of a substrate formed with the first specific electrode pattern, the second specific electrode pattern, and the metal wiring section 6. These figures merely illustrate a specific example of the following explanation, and the scope of the present disclosure should not be construed as being limited to these drawings.

In the method of manufacturing the capacitance-type input device, when the second resin layer 12 and the first resin layer 7 are formed, the transfer material of the present disclosure may be used to transfer the second resin layer 12 and the first resin layer 7 onto the surface of the transparent substrate 1, on which each element has been formed as desired.

In the method of manufacturing the capacitance-type input device, the mask layer 2, the first specific electrode pattern 3, the second specific electrode pattern 4, the insulating layer 5, and the metal wiring section 6 may also be formed using photosensitive films that include the temporary support body and the photocurable resin layer.

In cases in which the mask layer, the insulating layer, and the photocurable resin layer are employed and the permanent members such as the first specific electrode pattern, the second specific electrode pattern, and the metal wiring section are formed using photosensitive films, the photosensitive films may be exposed with patterns, if necessary, after lamination of a freely selected transfer member, and patterning may be obtained by using development treatment to remove the unexposed portions in the case of a negative-acting material, or the exposed portions in the case of a positive-acting material. The development may be development that removes the thermoplastic resin layer and the photocurable resin layer using different liquids, or may remove the thermoplastic resin layer and the photocurable resin layer using the same liquid. If necessary, a known development setup, such as a brush or a high pressure jet, may be employed in combination therewith. If necessary, post exposure and post baking may be performed after development.

<Photosensitive Film>

Explanation follows regarding photosensitive films other than the transfer material of the present disclosure that are preferably employed when manufacturing the capacitance-type input device of the present disclosure. The photosensitive film includes the temporary support body and the photocurable resin layer, and preferably includes a thermoplastic resin layer between the temporary support body and the photocurable resin layer. When the photosensitive film that includes the thermoplastic resin layer is used to form the mask layer and the like, air bubbles are not liable to be generated at elements formed by transferring the photocurable resin layer, image unevenness and the like is not liable to occur in the image display device, and excellent display characteristics can be obtained.

The photosensitive film may be a negative-acting material or a positive-acting material.

[Method of Manufacturing Layers Other than Photocurable Resin Layer]

The same temporary support body employed in the transfer material of the present disclosure may be employed as the temporary support body of the photosensitive film. The material described in paragraphs 0056 to 0060 of JP-A No. 2014-10814 may be employed as the thermoplastic resin layer employed in the photosensitive film. A known intermediate layer or oxygen barrier layer may be employed together with the thermoplastic resin layer. A method similar to the method of manufacturing the transfer material of the present disclosure may also be employed as the method of manufacturing the photosensitive film.

[Photocurable Resin Layer]

Additives are added to the photocurable resin layer in the photosensitive film depending on the purpose. Namely, in cases in which the photosensitive film is employed to form the mask layer, a colorant is included in the photocurable resin layer.

In cases in which the photosensitive film is a negative-acting material, the photocurable resin layer preferably includes an alkali soluble resin, a polymerizable compound, and a polymerization initiator or a polymerization initiator system. Colorants, other additives, etc. may also be employed, but there is no limitation thereto.

[Alkali Soluble Resin, Polymerizable Compound, and the Polymerization Initiator]

The same alkali soluble resin, polymerizable compound, and polymerization initiator or polymerization initiator system employed in the transfer material of the present disclosure may be employed as those included in the photosensitive film.

[Colorant (when Employed as the Mask Layer)]

In cases in which the photosensitive film is employed as a mask layer, a colorant may be employed in the photocurable resin layer. A known colorant (such as an organic pigment, an inorganic pigment, or a dye) can be appropriately employed as the colorant employed in the present disclosure. In the present disclosure, other than black colorants, a mixture of, for example, red, blue, and green color pigments or the like may also be employed.

In cases in which the photocurable resin layer is employed as a black mask layer, a black colorant is preferably included from the viewpoint of optical density. Examples of the black colorant include carbon black, titanium carbon, iron oxide, titanium oxide, and graphite, and of these, carbon black is preferable.

In cases in which the photocurable resin layer is employed as a white mask layer, the white pigments described in paragraph 0015 and 0114 of JP-A No. 2005-7765 may be employed. In order to employ the photocurable resin layer as a mask layer of another color, a pigment such as that described in paragraphs 0183 to 0185 of Japanese Patent Number 4546276, or a mixture of dyes may be employed. More specifically, the pigments and dyes described in paragraphs 0038 to 0054 of JP-A No. 2005-17716, the pigment described in paragraphs 0068 to 0072 of JP-A No. 2004-361447, the colorant described in paragraphs 0080 to 0088 of JP-A No. 2005-17521, or the like can be appropriately employed.

The colorant (preferably a pigment, more preferably carbon black) is preferably employed as a dispersion liquid. The dispersion liquid may be prepared by pre-mixing the colorant and a pigment dispersant to obtain a composition, and then adding the obtained composition to an organic solvent (or vehicle) described below, to cause dispersion. The vehicle refers to a portion of a medium in which pigment is caused to disperse when a paint is in a liquid state, and includes a component (binder) that is in a liquid state and that forms a coating film by binding with the pigment, and a component (organic solvent) that dissolves and dilutes the binder.

The disperser employed to cause the pigment to disperse is not particularly limited, and examples thereof include known dispersers such as the kneaders, roller mixers, attritors, super mills, dissolvers, homomixers, and sand mills described in Kunizo Asakura, "Encyclopedia of Pigments", first edition, Asakura Publishing Co., Ltd., 2000, page 438. Fine grinding may be performed using frictional force by the mechanical grinding described on page 310 of the above document.

From the viewpoint of dispersion stability, the colorant preferably has a number average particle diameter of from 0.001 µm to 0.1 µm, and more preferably has a number average particle diameter of from 0.01 µm to 0.08 µm. Here, "particle diameter" refers to the diameter of a circle having the same surface area as an electron micrograph of the particle, and "number average particle diameter" refers to the above diameter found for numerous particles, and is taken as an average value for 100 particles diameters.

The layer thickness of the photocurable resin layer that includes the colorant is preferably from 0.5 µm to 10 µm is more preferably from 0.8 µm to 5 µm and is particularly preferably from 1 µm to 3 µm from the viewpoint of having a difference in thickness from other layers. Although not particularly limited, the content ratio of the colorant with respect to the total solid content of the photocurable resin layer that includes the colorant is preferably from 15% by mass to 70% by mass, is more preferably from 20% by mass to 60% by mass, and is still more preferably from 25% by mass to 50% by mass, from the viewpoint of sufficiently shortening development time.

In cases in which the photosensitive film is used to form the insulating layer, the layer thickness of the photocurable resin layer that includes the colorant is preferably from 0.1 µm to 5 µm is more preferably from 0.3 µm to 3 µm and is particularly preferably from 0.5 µm to 2 µm from the viewpoint of maintaining insulating properties.

[Other Additives]

The photocurable resin layer that includes the colorant may also employ other additives. The same additives employed in the transfer material of the present disclosure may be employed as these additives. The same solvent employed in the transfer material of the present disclosure may be employed as the solvent when the photosensitive film is produced by coating.

Although the above explanation has focused on cases in which the photosensitive film is a negative-acting material, the photosensitive film may be a positive-acting material. In cases in which the photosensitive film is a positive-acting material, for example, the material described in JP-A No. 2005-221726 or the like may be employed in the photocurable resin layer that includes the colorant; however, there is no limitation thereto.

[Viscosity of Thermoplastic Resin Layer and Photocurable Resin Layer]

Preferably, the viscosity of the thermoplastic resin layer measured at 100° C. is in a range of from 1,000 Pa·sec to 10,000 Pa·sec, the viscosity of the photocurable resin layer measured at 100° C. is from in a range of from 2,000 Pa·sec to 50,000 Pa·sec, and Equation (A) below is satisfied.

$$\text{viscosity of thermoplastic resin layer} < \text{viscosity of photocurable resin layer} \quad \text{Equation (A):}$$

Here, the viscosity of each layer can be measured as follows. The thermoplastic resin layer coating liquid or the photocurable resin layer coating liquid having had solvent removed therefrom by drying at atmospheric pressure and reduced pressure may be taken as a measurement sample, and, for example, a VIBRON (DD-III manufactured by Toyo Baldwin Co. Ltd.) may be used as a measurement device to measure under conditions of a measurement start temperature of 50° C., a measurement end temperature of 150° C., a temperature rise rate of 5° C./min, and a vibration frequency of 1 Hz/deg, and the measurement value at 100° C. may be employed.

<Mask Layer and Insulating Layer Formation Using Photosensitive Film>

The mask layer 2 and the insulating layer 5 can be formed by transferring the photocurable resin layer to the transparent substrate 1 or the like using the photosensitive film. For example, the black mask layer 2 can be formed by transferring a black photocurable resin layer onto the surface of the transparent substrate 1 using a photosensitive film that includes the black photocurable resin layer as the photocurable resin layer. The insulating layer 5 can be formed by transferring the photocurable resin layer onto the surface of the transparent substrate 1 formed with the first specific electrode pattern using the photosensitive film that includes an insulating photocurable resin layer as the photocurable resin layer.

In formation of a mask layer 2 requiring light blocking characteristics, by employing the photosensitive film having the specific layer configuration that includes the thermoplastic resin layer between the photocurable resin layer and the temporary support body, air bubbles can be prevented from being generated when laminating the photosensitive film, and a high quality mask layer 2 having no light leakage can be formed.

<Formation of First Specific Electrode Pattern, Second Specific Electrode Pattern, and Metal Wiring Section Using Photosensitive Film>

The first specific electrode pattern 3, the second specific electrode pattern 4, and the metal wiring section 6 may be formed using etching or a photosensitive film that includes an electrically conductive photocurable resin layer, or may be formed using a photosensitive film as a liftoff material.

[Etching]

In cases in which the first specific electrode pattern 3, the second specific electrode pattern 4, and the metal wiring section 6 are formed by etching, first, a transparent electrode layer such as ITO is formed by sputtering on the non-contact face of the transparent substrate 1, which is formed with the mask layer 2 and the like. Next, the photosensitive film having an etchable photocurable resin layer is used as the photocurable resin layer above the transparent electrode layer to form an etching pattern by exposure and development. Subsequently, the transparent electrodes are patterned by etching the transparent electrode layer, and the first specific electrode pattern 3 or the like can be formed by removing the etching pattern.

A resist pattern can be obtained by a method similar to the method above, even in cases in which the photosensitive film is employed as the etching resist (etching pattern). As the etching, etching by a known method described in, for example, paragraphs 0048 to 0054 of JP-A No. 2010-152155 can be suitably appropriately employed to peel off the resist.

Examples of the etching method include a commonly performed wet etching method of immersion in liquid etchant. An acid type or an alkali type etchant may appropriately selected as the liquid etchant employed in the wet etching in accordance with the etching target. Examples of acid type liquid etchants include aqueous solutions that include a single acid component such as hydrochloric acid, sulfuric acid, hydrofluoric acid, or phosphoric acid, and solutions of mixtures of an acid component with a salt such as iron (ii) chloride, ammonium fluoride, potassium permanganate, or the like. The acid component may employ a combination of plural acid components. Examples of alkali-type liquid etchants include aqueous solutions of a single alkali component such as sodium hydroxide, potassium hydroxide, ammonia, organic amines, a salt of an organic amine such as tetramethyl ammonium hydroxide, aqueous solutions of mixtures of an alkali component and a salt such as potassium permanganate. The alkali component may employ a combination of plural alkali components.

Although not particularly limited, the temperature of the liquid etchant is preferably 45° C. or less. In the present disclosure, the resin pattern employed as the etching mask (etching pattern) exhibits particularly excellent resistance to acid or alkali liquid etchants at this temperature range due to being formed using the photocurable resin layer described above. Accordingly, peeling of the resin pattern during the process of etching is prevented, and portions where the resin pattern is not present are selectively etched.

After the etching, if necessary, a process of washing and a process of drying may be performed to prevent line fouling. As the process of washing, for example, the substrate on which each layer is formed may be washed with purified water for from 10 seconds to 300 seconds at room temperature, and as the process of drying, an air blower may be employed and an air blower pressure (from approximately 0.1 kg/cm$^2$ to approximately 5 kg/cm$^2$) may be appropriately adjusted.

Examples of the method of subsequently peeling off the resin pattern are not particularly limited, and examples thereof include a method in which the substrate on which each layer is formed is immersed in a peeling liquid for from 5 minutes to 30 minutes while agitated at from 30° C. to 80° C., and preferably at from 50° C. to 80° C. Although the resin pattern employed as the etching mask in the present disclosure has the property of exhibiting excellent resistance to chemical solutions at 45° C. or below as described above, the resin pattern exhibits swelling due to the alkalinity of the peeling liquid when the temperature of chemical solution is 50° C. or above. Due to this property, the process time is short when the process of peeling employs a peeling liquid at from 50° C. to 80° C., and this has the merit of there being little peeling residue from the resin pattern. Namely, due to the difference in the chemical solution temperature between the process of etching and the process of peeling, the resin pattern employed as the etching mask in the present disclosure exhibits excellent resistance to chemical solutions in the process of etching, and exhibits excellent peelability in the process of peeling, and can achieve the conflicting characteristics of both resistance to chemical solutions and peelability.

Examples of the peeling liquid include inorganic alkali components such as sodium hydroxide, potassium hydroxide, organic alkali components such as tertiary amine or a salt of a quaternary ammonium, dissolved in water, dimethylsulfoxide, N-methylpyrrolidone, or a mixed solution thereof. The peeling liquid described above may be employed, and peeling may be performed by a spray method, a shower method, a paddle method, or the like.

[Photosensitive Film Including Electrically Conductive Photocurable Resin Layer]

In cases in which the first specific electrode pattern 3, the second specific electrode pattern 4, and the metal wiring section 6 are formed using the photosensitive film that includes an electrically conductive photocurable resin layer, these can be formed by transferring the electrically conductive photocurable resin layer onto the surface of the transparent substrate 1.

When the first specific electrode pattern 3 or the like is formed using the photosensitive film that includes the electrically conductive photocurable resin layer, touch panel production is enabled with the merit of being a simple process that obtains a thin layer/reduced weight without leakage of the resist components from the opening portions even when the substrate has an opening, and without fouling the substrate rear side.

Moreover, in the formation of the first specific electrode pattern 3, the second specific electrode pattern 4, and the metal wiring section 6, using a photosensitive film that includes a specific layer configuration including a thermoplastic resin layer between the electrically conductive photocurable resin layer and the temporary support body prevents air bubbles from being generated during lamination of the photosensitive film, and enables the first specific electrode pattern 3, the second specific electrode pattern 4, and the metal wiring section 6 to be formed with electrical conductivity and excellently low electrical resistance.

—Electrically Conductive Photocurable Resin Layer—

The following electrically conductive fibers or the like can be employed in the photocurable resin layer, in cases in which the first specific electrode pattern and the second specific electrode pattern, or another electrically conductive element is formed using the photosensitive film in which the electrically conductive photocurable resin layer has been stacked.

Although not particularly limited, the structure of the electrically conductive fibers can be appropriately selected in accordance with the object, and preferably has either a solid core structure or a hollow structure.

Here, fibers having a solid core structure are referred to as "wires", and fibers having a hollow structure are referred to as "tubes". Electrically conductive fibers having an average short axis length of from 5 nm to 1,000 nm and an average long axis length of from 1 µm to 100 µm are referred to as "nanowires".

Electrically conductive fibers having an average short axis length of from 1 nm to 1,000 nm and an average long axis length of from 0.1 µm to 1,000 µm and having a hollow structure may be referred to as "nanotubes".

The material of the electrically conductive fibers is not particularly limited as long as the material is electrically conductive, and although the material may be appropriately selected according to the object, the material is preferably at least one of a metal or carbon, and of these, the electrically conductive fibers are particularly preferably at least one of metal nanowires, metal nanotubes, or carbon nanotubes.

—Metal Nanowire—
—Metal—

The material of the metal nanowires is not particularly limited, and, for example, is preferably at least one metal selected from the group consisting of the fourth period, the fifth period, and the sixth period of the long form of the periodic table (IUPAC 1991), is more preferably at least one metal selected from the group consisting of the second to the fourteenth groups, and is still more preferably at least one metal selected from the group consisting of the second group, the eighth group, the ninth group, the tenth group, the eleventh group, the twelfth group, the thirteenth group, and the fourteenth group.

The metal nanowire particularly preferably includes the metal as the main component thereof. In the present disclosure, main component refers to a component included at a content of 50% or greater by mass.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. Of these, a substance including mostly silver, or a substance containing an alloy of silver and a metal other than silver is preferable, from the viewpoint of excellent electrically conductivity.

Including mostly silver means that 50% by mass or greater of the metal nanowire is silver, and preferably 90% by mass or greater of the metal nanowire is silver.

Examples of metals employed in the alloy with silver include platinum, osmium, palladium, and iridium. These may be employed singly or in a combination of two or more types thereof.

—Shape—

The shape of the metal nanowires is not particularly limited, and may be appropriately selected according to the object. For example, the shape may be a freely selected shape such as a circular column, a rectangular cuboid, or a column having a polygonal cross-section with rounded corners. In applications that require high transparency, a column or a shape having a polygonal cross-section with rounded corners is preferable.

The cross-section shape of the metal nanowire can be examined by coating an aqueous metal nanowire dispersion onto a substrate and inspecting the cross-section by transmission electron microscopy (TEM).

Figure 17:
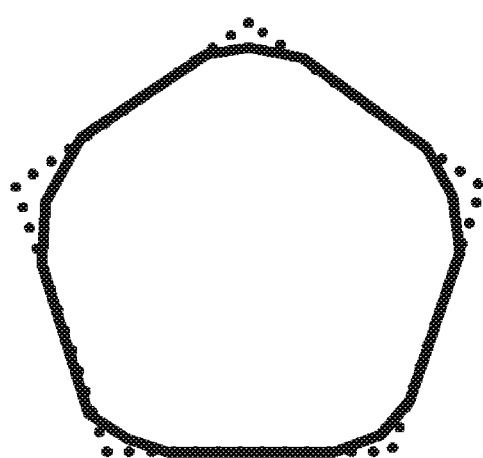
FIG. 17 is an explanatory diagram illustrating a cross-section of a metal nanowire.

The corners of the cross-section of the metal nanowire refer to peripheral edges at points where extensions of each edge of the cross-section intersect with orthogonal lines from adjacent edges. Moreover, "respective edges of the cross-section" refers to straight lines that connect these adjacent corners together. In such cases, the ratio of the "outer peripheral length of the cross-section" to the total length of the "respective edges of the cross-section" is taken as a degree of sharpness. The degree of sharpness may, for example, be represented by the ratio of the outer peripheral length of the cross-section indicated by the solid line to the outer peripheral length of a pentagon indicated by the dotted line in a metal nanowire cross-section like that illustrated in FIG. 17. A cross-section profile in which this degree of sharpness is 75% or less is defined as a cross-section shape with rounded corners. The degree of sharpness is preferably 60% or less, and is more preferably 50% or less. If the degree of sharpness is 75% or less, transparency is excellent with yellow tinging not easily arising, perhaps due to localization of electrons in the corners being suppressed and an increase in plasmon adsorption being suppressed. Moreover, edge portions of the pattern have good straightness, and slack does not easily arise. The minimum of the degree of sharpness is preferably 30% and is more preferably 40%.

—Average Short Axis Length and Average Long Axis Length—

The average short axis length (referred to as the average short axis diameter or the average diameter hereafter) of the metal nanowire is preferably 150 nm or less, is more preferably from 1 nm to 40 nm, is still more preferably from 10 nm to 40 nm, and is particularly preferably from 15 nm to 35 nm.

When the average short axis length is less than 1 nm, resistance to oxidation worsens and durability is poor, and when the average short axis length exceeds 150 nm, this causes scattering to arise in the metal nanowire, and sufficient transparency can no longer be obtained.

The average short axis length of the metal nanowire is inspected for 300 metal nanowires using a transmission electron microscope (TEM; JEM-2000FX manufactured by JEOL Ltd.), and the average short axis length of the metal nanowire is found from the average value thereof. In cases in which the short axis of the metal nanowire is not circular, the longest short axis length is taken as the short axis length.

The average long axis length of the metal nanowire (also referred to as the "average length") is preferably from 1 µm to 40 µm, is more preferably from 3 µm to 35 µm, and is still more preferably from 5 µm to 30 µm.

When the average long axis length is 1 µm or greater, dense networks are easily formed, and sufficient electrical conductivity is obtained, and when the average long axis length is 40 µm or less, the metal nanowire is not too long, tangling does not easily occur during production, and flocculation does not easily arise in the production process.

The average long axis length of the metal nanowire is, for example, inspected for 300 metal nanowires using a transmission electron microscope (TEM; JEM-2000FX manufactured by JEOL Ltd.), and the average long axis length of the metal nanowire is found from the average value thereof. In cases in which the metal nanowire is bent, a circle given by the arc is considered, and a value computed from the radius and radius of curvature thereof is taken as the long axis length.

From the viewpoint of suitability for processing, such as stability of the coating liquid, drying during coating, and development time during patterning, the layer thickness of the electrically conductive photocurable resin layer is preferably from 0.1 µm to 20 µm, is more preferably from 0.5 µm to 18 µm, and is particularly preferably from 1 µm to 15 µm. From the viewpoint of electrical conductivity and stability of the coating liquid, the content of the electrically conductive fibers with respect to the total solid content of the electrically conductive photocurable resin layer is preferably from 0.01% by mass to 50% by mass, is more preferably from 0.05% by mass to 30% by mass, and is particularly preferably from 0.1% by mass to 20% by mass.

The first specific electrode pattern, the second specific electrode pattern, and the other electrically conductive elements can be formed using the photosensitive film as a liftoff material. In such cases, after patterning using the photosensitive film, a desired transparent electrically conductive layer pattern can be obtained by performing dissolving-removal of the photocurable resin layer for each deposited transparent electrically conductive layer after forming the transparent electrically conductive layer on the entire surface of the substrate (liftoff method).

[Use of the Photosensitive Film as a Liftoff Material]

The first specific electrode pattern, the second specific electrode pattern, and other electrically conductive elements can be formed using the photosensitive film as a liftoff material. In such cases, after patterning using the photosensitive film, a desired transparent electrically conductive layer pattern can be obtained by performing dissolving-removal of the photocurable resin layer for each deposited transparent electrically conductive layer after forming the transparent electrically conductive layer on the entire surface of the substrate formed by each layer (liftoff method).

(Image Display Device)

The image display device of the present disclosure is provided with the capacitance-type input device of the present disclosure, serving as a configuration element.

The capacitance-type input device of the present disclosure and the image display device provided with the capacitance-type input device as a configuration element may apply the configurations described in, for example, "Latest Touch Panel Technology" (published Jul. 6, 2009, by Techno Times), edited by Yuji Mitani, "Touch Panel Technology and Development", CMC Publishing Co., Ltd. (2004, 12), FPD International 2009 Forum T-11 Lecture Textbook, and Cypress Semiconductor Corporation Application Note AN2292.

The method of manufacturing the image display device of the present disclosure includes a process of transferring the first resin layer and the second resin layer from the transfer material of the present disclosure.

The process of transferring the first resin layer and the second resin layer from the transfer material of the present disclosure is synonymous with the process of transferring the first resin layer and the second resin layer from the transfer material in the method of manufacturing the laminated body of the present disclosure, and has similar preferable configurations.

The method of manufacturing the image display device of the present disclosure may further include a process that may be included in the method of manufacturing the laminated body of the present disclosure.

EXAMPLES

Examples are given below to more specifically explain the present disclosure. Materials, usage amounts, ratios, treatment details, treatment procedures and the like described in the examples below can be modified as appropriate within limits not departing from the spirit of the present disclosure. Accordingly, the scope of the present disclosure is not limited to the specific examples given below. Note that "parts" and "%" are based on mass unless specifically stated otherwise.

Examples 1 to 14, Comparative Examples 1 and 2

<Production of Transfer Material Provided with First Resin Layer and Second Resin Layer>
[Formation of First Resin Layer]

In each example and each comparative example, Material A1 to Material A9 for forming a first resin layer were prepared according to the compositions listed in Table 1. Each material out of Material A1 to Material A9 was coated onto a temporary support body, which was a polyethylene terephthalate film of thickness 25 µm using a slit shaped nozzle so as to adjust the film thickness after drying to 8 µm. Then, after drying at 100° C. for two hours, a further 1 minute of drying at 120° C. was performed to form a first resin layer above the temporary support body. The first resin layers were layers that did not completely dissolve and/or disperse within an immersion time of 10 min per µm of film thickness when immersed in 25° C. water. The material that was employed in each example and in each comparative example is listed in Table 4.

In Table 1, percentages listed in the substance column represent the content ratios of compounds included in each substance (% by mass), numerical values listed in the Material A1 to Material A9 columns represent contents of each substance (parts by mass), and where a dash ("-") is listed, this indicates that the corresponding component was not included.

TABLE 1

| | Substance | Material A1 | Material A2 | Material A3 | Material A4 | Material A5 |
|---|---|---|---|---|---|---|
| Polymerizable Compound | DPHA solution (dipentaerythritol hexaacrylate: 38%, dipentaerythritol pentaacrylate: 38%, 1-methoxy-2-propylacetate: 24%) | — | 2.92 | — | — | — |
| | Acrylic-based monomer: NK ESTER A-DCP, manufactured by Shin-Nakamura Chemical Co., Ltd. | 3.14 | — | 3.86 | 5.63 | 3.14 |
| | Acrylic-based monomer: NK ESTER A-TMPT, manufactured by Shin-Nakamura Chemical Co., Ltd. | — | — | 2.57 | — | — |
| | Urethane-based monomer: NK OLIGO UA-32P, manufactured by Shin-Nakamura Chemical Co., Ltd.: 75% non-volatile component, 1-methoxy-2-propylacetate: 25% | 6.28 | 3.60 | — | 2.82 | 6.28 |
| | Monomer mixture (polymerizable compound (b2-1) described in paragraph number [0111] of Japanese Patent Application Laid-Open (JP-A) No. 2012-78528, n = 1: tripentaerythritol octaacrylate content 85%, total of n = 2 and n = 3 of 15% as impurities) | — | 1.85 | — | — | — |
| | Acrylic-based monomer: ARONIX M-310, manufactured by Toagosei Co., Ltd. | — | — | — | 1.88 | — |
| Binder Polymer | Polymer solution 1 (Structural Formula P-25 described in paragraph number [0058] of JP-A. No. 2008-146018: weight average molecular weight = 35,000, acid value 56 mg KOH/g, solid content 45%, 1-methoxy-2-propylacetate 15%, 1-methoxy-2-propanol 40%), SP value: 22.99 MPa$^{1/2}$ | 26.17 | 29.59 | 28.13 | 42.38 | 24.84 |
| Polymerization Initiator | Photo-Radical Polymerization Initiator: 2-benzyl-2-dimethylamino-1-(4-morpholinophenyl)butanone (IRGACURE 379, manufactured by BASF SE) | 0.29 | 0.18 | — | — | 0.29 |
| | Photopolymerization Initiator: KAYACURE-DETX-S (manufactured by Nippon Kayaku Co., Ltd., alkylthio xanthone) | — | 0.18 | — | — | — |
| | Photo-Radical Polymerization Initiator: IRGACURE 907, manufactured by BASF SE | — | — | 0.71 | 0.22 | — |
| | Photo-Radical Polymerization Initiator: 1,2-octane dione, 1-[4-(phenylthio)-, 2-(O-benzoyloxime)] (IRGACURE OXE-01, manufactured by BASF SE) | — | — | — | 0.11 | — |
| Solvent | 1-methoxy-2-propyl acetate | 26.57 | 31.62 | 27.75 | — | 27.31 |
| | Methyl ethyl ketone | 37.46 | 30.04 | 36.77 | 41.77 | 37.46 |
| Specific Compound | Benzimidazole | — | — | 0.20 | — | — |
| | Benzotriazole | — | — | — | 0.67 | — |
| | 1-[N,N-bis(2-ethylhexyl)aminomethyl]benzotriazole | — | — | — | — | 0.6 |
| | 2,2'-{[(methyl-1H-benzotriazole-1-yl)methyl]imino}bisethanol | — | — | — | — | — |
| | Carboxybenzotriazole | — | — | — | — | — |
| Other Additives | Surfactant (compound represented by Formula (3) below: weight average molar weight 15000, 30% non-volatile component, methyl ethyl ketone 70%) | 0.01 | 0.02 | 0.01 | 0.07 | 0.01 |
| | Polymerization inhibitor: phenothiazine, manufactured by Wako Pure Chemical Industries, Ltd. | 0.08 | — | — | — | 0.08 |
| | DURANATE TPA-B80E (manufactured by Asahi Kasei Chemicals Corporation: 80% non-volatile component) | — | — | — | 4.53 | — |
| | Total (parts by mass) | 100 | 100 | 100 | 100 | 100 |
| | Solid Concentration (% by mass) | 20.0 | 20.5 | 20.0 | 33.3 | 20.0 |
| | Content of Specific Compound With Respect To Total Solids (% by mass) | — | — | 1.0 | 2.0 | 3.0 |

| | Substance | Material A6 | Material A7 | Material A8 | Material A9 |
|---|---|---|---|---|---|
| Polymerizable Compound | DPHA solution (dipentaerythritol hexaacrylate: 38%, dipentaerythritol pentaacrylate: 38%, 1-methoxy-2-propylacetate: 24%) | 2.92 | — | — | 2.92 |
| | Acrylic-based monomer: NK ESTER A-DCP, manufactured by Shin-Nakamura Chemical Co., Ltd. | — | 3.86 | 5.63 | — |
| | Acrylic-based monomer: NK ESTER A-TMPT, manufactured by Shin-Nakamura Chemical Co., Ltd. | — | 2.57 | — | — |
| | Urethane-based monomer: NK OLIGO UA-32P, manufactured by Shin-Nakamura Chemical Co., Ltd.: 75% non-volatile component, 1-methoxy-2-propylacetate: 25% | 3.60 | — | 2.82 | 3.60 |
| | Monomer mixture (polymerizable compound (b2-1) described in paragraph number [0111] of Japanese Patent Application Laid-Open (JP-A) No. 2012-78528, n = 1: tripentaerythritol octaacrylate content 85%, total of n = 2 and n = 3 of 15% as impurities) | 1.85 | — | — | 1.85 |
| | Acrylic-based monomer: ARONIX M-310, manufactured by Toagosei Co., Ltd. | — | — | 1.88 | — |
| Binder Polymer | Polymer solution 1 (Structural Formula P-25 described in paragraph number [0058] of JP-A. No. 2008-146018: weight average molecular weight = 35,000, acid value 56 mg KOH/g, solid content 45%, 1-methoxy-2-propylacetate 15%, 1-methoxy-2-propanol 40%), SP value: 22.99 MPa$^{1/2}$ | 27.32 | 25.01 | 37.11 | 24.15 |

TABLE 1-continued

| | | | | | |
|---|---|---|---|---|---|
| Polymerization Initiator | Photo-Radical Polymerization Initiator: 2-benzyl-2-dimethylamino-1-(4-morpholinophenyl)butanone (IRGACURE 379, manufactured by BASF SE) | 0.18 | — | — | 0.18 |
| | Photopolymerization Initiator: KAYACURE-DETX-S (manufactured by Nippon Kayaku Co., Ltd., alkylthio xanthone) | 0.18 | — | — | 0.18 |
| | Photo-Radical Polymerization Initiator: IRGACURE 907, manufactured by BASF SE | — | 0.71 | 0.22 | — |
| | Photo-Radical Polymerization Initiator: 1,2-octane dione, 1-[4-(phenylthio)-, 2-(O-benzoyloxime)] (IRGACURE OXE-01, manufactured by BASF SE) | — | — | 0.11 | — |
| Solvent | 1-methoxy-2-propyl acetate | 32.87 | 27.53 | — | 31.62 |
| | Methyl ethyl ketone | 30.04 | 38.71 | 44.66 | 33.04 |
| Specific Compound | Benzimidazole | — | — | — | 2.45 |
| | Benzotriazole | — | — | 3.37 | — |
| | 1-[N,N-bis(2-ethylhexyl)aminomethyl]benzotriazole | — | 1.6 | — | — |
| | 2,2'-{[(methyl-1H-benzotriazole-1-yl)methyl]imino}bisethanol | 1.02 | — | — | — |
| | Carboxybenzotriazole | — | — | — | — |
| Other Additives | Surfactant (compound represented by Formula (3) below: weight average molar weight 15000, 30% non-volatile component, methyl ethyl ketone 70%) | 0.02 | 0.01 | 0.07 | 0.02 |
| | Polymerization inhibitor: phenothiazine, manufactured by Wako Pure Chemical Industries, Ltd. | — | — | — | — |
| | DURANATE TPA-B80E (manufactured by Asahi Kasei Chemicals Corporation: 80% non-volatile component) | — | — | 4.53 | — |
| | Total (parts by mass) | 100 | 100 | 100 | 100 |
| | Solid Concentration (% by mass) | 20.5 | 20.0 | 33.7 | 20.5 |
| Content of Specific Compound With Respect To Total Solids (% by mass) | | 5.0 | 8.0 | 10.0 | 12.0 |

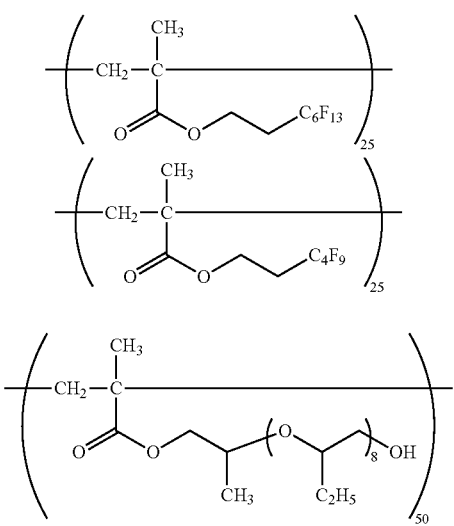

The numerical value at the bottom right of the parentheses indicates the mass ratio of each structural unit in the compound represented by Formula (3), and the numerical value at the bottom right of the parentheses for the butylene oxide group indicates the number of repeating units.

[Formation of Second Resin Layer]

Material B1 to Material B14 for the second resin layer were prepared in accordance with the compositions listed in Table 2 and Table 3 below. Each out of Material B1 to Material B14, in the combinations listed in Table 4 below, was coated onto the first resin layer so as to be adjusted to a film thickness after drying of 0.1 Then, this was dried to form a second resin layer above the first resin layer. The material that was employed in each example and each comparative example is listed in Table 4.

In Table 2 and Table 3, percentages listed in the substance column represent the content ratio of compounds included in each substance (% by mass) where not written as mol %, numerical values listed in the Material B1 to Material B14 columns represent content of each substance (parts by mass), and where a dash ("-") is listed, this indicates that the corresponding component is not included.

TABLE 2

| | Substance | Material B1 | Material B2 | Material B3 | Material B4 | Material B5 | Material B6 | Material B7 |
|---|---|---|---|---|---|---|---|---|
| Water-Based Solvent | Methanol | 748 | 748 | 748 | 761 | 748 | 747 | 748 |
| | Deionized Water | 233 | 213 | 233 | 233 | 232 | 213 | 232 |
| Water Soluble Monomer | Acrylic-based monomer: ARONIX M-310, manufactured by Toagosei Co., Ltd. | 0.30 | 0.30 | 0.30 | 0.30 | 0.30 | 0.30 | 0.30 |
| Water Soluble Polymer | Polyvinyl acetal resin 20% aqueous solution (trade name: S-LEC KW-1, acetal concentration 9 mol %, hydroxy group content 90% mol) manufactured by Sekisui Chemical Co., Ltd., SP value: 25.08 | 18.65 | — | 18.65 | — | 18.65 | — | 18.65 |
| | Polyvinyl alcohol resin 10% aqueous solution (PVA205C degree of saponification 88 mol %, hydroxy group content 88 mol %, degree of polymerization 550, manufactured by Kuraray Co., Ltd, dissolved in water to give a 10% aqueous solution), SP value: 25.04 | — | 38.50 | — | — | — | 38.50 | — |

TABLE 2-continued

| Substance | | Material B1 | Material B2 | Material B3 | Material B4 | Material B5 | Material B6 | Material B7 |
|---|---|---|---|---|---|---|---|---|
| | Methacrylic acid/methyl methacrylate copolymer resin (Mw: 15000, compounding ratio: 40/60, non-volatile component 99.8%), SP value: 29.30 | — | — | — | 5.50 | — | — | — |
| Specific Compound | Imidazole | — | 0.09 | — | — | — | — | — |
| | Benzimidazole | 0.05 | — | — | 0.05 | 0.05 | 0.05 | 0.05 |
| | Benzotriazole | — | — | 0.13 | — | — | — | — |
| | Tetrazole | — | — | — | 0.31 | — | — | — |
| | mercaptothiadiazole | — | — | — | — | 0.38 | — | — |
| | 1-[N,N-bis(2-ethylhexyl)aminomethyl]benzotriazole | — | — | — | — | — | 0.50 | — |
| | 2,2'-{[(methyl-1H-benzotriazole-1-yl)methyl]imino}bisethanol | — | — | — | — | — | — | 0.56 |
| | carboxybenzotriazole | — | — | — | — | — | — | — |
| Water Soluble Polymerization Initiator | Water Soluble Photopolymerization Initiator: IRGACURE 2959, manufactured by BASF SE | 0.31 | 0.31 | 0.31 | — | 0.31 | 0.31 | — |
| | Total (parts by mass) | 1000 | 1000 | 1000 | 1000 | 1000 | 1000 | 1000 |
| | Solid Concentration (% by mass) | 4.4 | 4.5 | 4.5 | 6.2 | 4.8 | 5.0 | 4.6 |
| | Content of Specific Compound With Respect to Total Solids (% by mass) | 1.0 | 2.0 | 3.0 | 5.0 | 8.0 | 10.0 | 12.0 |

TABLE 3

| | Substance | Material B8 | Material B9 | Material B10 | Material B11 | Material B12 | Material B13 | Material B14 |
|---|---|---|---|---|---|---|---|---|
| Water-Based Solvent | Methanol | 760 | 748 | 748 | 760 | 748 | 747 | 760 |
| | Deionized Water | 233 | 232 | 213 | 233 | 213 | 233 | 233 |
| Water Soluble Monomer | Acrylic-based monomer: ARONIX M-310, manufactured by Toagosei Co., Ltd. | 0.30 | 0.30 | 0.30 | 0.30 | 0.30 | 0.30 | 0.30 |
| Water Soluble Polymer | Polyvinyl acetal resin 20% aqueous solution (trade name: S-LEC KW-1, acetal concentration 9 mol %, hydroxy group content 90 mol %) manufactured by Sekisui Chemical Co., Ltd., SP value: 25.08 | — | 18.65 | — | — | — | 18.65 | — |
| | Polyvinyl alcohol resin 10% aqueous solution (PVA205C degree of saponification 88 mol %, hydroxy group content 88 mol %, degree of polymerization 550, manufactured by Kuraray Co., Ltd, dissolved in water to give a 10% aqueous solution), SP value: 25.04 | — | — | 38.50 | — | 38.50 | — | — |
| | methacrylic acid/methyl methacrylate copolymer resin (Mw: 15000, compounding ratio: 40/60, non-volatile components 99.8%), SP value: 29.30 | 5.50 | — | — | 5.50 | — | — | 5.50 |
| Specific Compound | Imidazole | — | — | — | — | — | — | — |
| | Benzimidazole | 0.05 | 0.05 | 0.05 | 0.05 | 0.05 | 0.05 | 0.05 |
| | Benzotriazole | — | — | — | — | — | — | — |
| | Tetrazole | — | 0.56 | — | — | — | — | 1.45 |
| | Mercaptothiadiazole | — | — | 0.56 | — | — | — | — |
| | 1-[N,N-bis(2-ethylhexyl)aminomethyl]benzotriazole | — | — | — | 0.80 | — | — | — |
| | 2,2'-{[(methyl-1H-benzotriazole-1-yl)methyl]imino}bisethanol | — | — | — | — | 0.57 | — | — |
| | Carboxybenzotriazole | 0.80 | — | — | — | — | 0.72 | — |
| Water Soluble Polymerization Initiator | Water Soluble Photopolymerization Initiator: IRGACURE 2959, manufactured by BASF SE | — | — | — | — | — | — | — |
| | Total (parts by mass) | 1000 | 1000 | 1000 | 1000 | 1000 | 1000 | 1000 |
| | Solid Concentration (% by mass) | 6.6 | 4.6 | 4.8 | 6.6 | 4.8 | 4.8 | 7.3 |
| | Content of Specific Compound With Respect To Total Solids (% by mass) | 12.0 | 12.0 | 12.0 | 12.0 | 12.0 | 15.0 | 20.0 |

[Pressure Bonding of Protective Film]

On a laminated body provided with the first resin layer and the second resin layer above the temporary support body, a protective film (polypropylene film having a thickness of 12 μm) is finally pressure bonded to the second resin layer.

A transfer material is thus produced in which the temporary support body, the first resin layer, the second resin layer, and the protective film are integrated. The obtained transfer materials were used as transfer materials for each example and each comparative example.

<Corrosion Resistance Evaluation on Copper Foil Plated Polyimide Film of Each Example and Comparative Example>

Model tests were performed in order to evaluate the corrosion resistance for metal wiring of the transfer materials of the examples and comparative examples.

Using a Lamic II model laminator (manufactured by Hitachi Industries) at a conveyance speed of 1 m/min under pressure and temperature conditions of a line pressure of 100 N/cm, an upper roll temperature of 90° C., and a lower roll temperature of 90° C., the transfer materials of each example and comparative example having the protective film peeled off were affixed onto a polyethylene terephthalate film plated with a 100 μm thick copper film by sputtering. Next, after peeling off the temporary support body, a high pressure mercury lamp, without an exposure mask, was used to perform exposure (1,000 mJ/cm$^2$), baking treatment (150° C., 30 min) was performed, and a sample for evaluation was obtained.

Next, for a transfer layer surface of the obtained substrate sample, with reference to Japanese Industrial Standard (JIS) L 0848:2004, the surface of the sputtered-copper-provided polyethylene terephthalate film was inspected for copper corrosion after being left for 300 hours under a hot and humid environment of 85° C. and 85% humidity after depositing a drop of human perspiration.

Then, the sheet resistance value (Ω/sq) is measured at 5 freely selected locations on the substrate using a Loresta-GP MCP-T610 model (manufactured by Mitsubishi Chemical Analytech Co., Ltd.), and evaluation in accordance with the evaluation criteria below was made based on the average values in the change in the resistance value before and after the hot humidity testing of the measurement values. The evaluation results are listed in Table 4. In table 4, the numerical values listed in the "content of specific compound in second resin layer (% by mass)" column denote the content (% by mass) of the specific compound with respect to the total solid content of the second resin layer, and the numerical values listed in the "content of specific compound in first resin layer (% by mass)" column denote the content (% by mass) of the specific compound with respect to the total solid content of the first resin layer, respectively.

The change in the resistance value before and after the hot humidity test was calculated employing the following equation.

Change (%) in resistance value before and after the hot humidity test=(1−sheet resistance value after hot humidity test (Ω/sq)/sheet resistance value before hot humidity test (Ω/sq))×100

An evaluation result of 5, 4, or 3 enables usage without problems in practice, 5 or 4 is preferable, and 5 is more preferable.
5: Discoloration was not observed on the surface of the test piece, and change in the resistance value before and after the hot humidity test was within 5%
4: Discoloration was observed on a portion of the test piece, but change in the resistance value before and after the hot humidity test was within 5%
3: Discoloration was observed on the entire surface of the test piece, but change in the resistance value before and after the hot humidity test was within 5%
2: Discoloration was observed on the surface of the test piece, and ratio of change in the resistance value before and after the hot humidity test was 5% or greater
1: Discoloration was observed on the entire test piece, and ratio of change in the resistance value before and after the hot humidity test was 5% or greater <Pencil Hardness Evaluation>

As an index of scratch resistance, pencil hardness evaluation was made in accordance with JIS K 5400 after forming a film employing the transfer material of each of the examples and comparative examples to transfer onto a glass substrate.

More specifically, the first resin layer, the second resin layer, and the temporary support body were transferred onto a glass substrate using the transfer material of each of the examples and each of the comparative examples from which the protective film had been peeled off (temperature of the transparent film substrate: 40° C., rubber roller temperature: 110° C., line pressure: 3 N/cm, conveyance rate: 2 m/min).

Subsequently, a proximity-type exposure system (manufactured by Hitachi High-Tech Electronics Engineering Co., Ltd.) having an ultrahigh pressure mercury lamp was employed to expose through the temporary support body with an exposure amount of 150 mJ/cm$^2$ (i-line). Post baking treatment was performed at 145° C. for 30 minutes after peeling off the temporary support body. A laminated body in which the second resin layer and the first resin layer were stacked above the glass substrate was thereby obtained. Note that the laminated body was a fully transparent laminated body.

The transparent laminated body was evaluated using a testing pencil stipulated by JIS S 6006 with a load of 500 g and n=7 after one hour of humidity regulation at relative humidity of 60% at a temperature of 25° C. Less than three scratches were taken as a pass, and three or more was taken as a failure. The evaluation results are listed in Table 4. HB and above are in a usable range, H and above are preferable, and 2H and above are more preferable.

TABLE 4

| | | Second Resin Layer | | First Resin Layer | | Evaluation Result | |
|---|---|---|---|---|---|---|---|
| | Material of Second Resin Layer | Content of Specific Compound In Second Resin Layer (% By Mass) | Material of First Resin Layer | Content of Specific Compound In First Resin Layer (% by mass) | | Resistance to Corrosion | Pencil Hardness |
| Example 1 | Material B3 | 3 | Material A1 | 0 | | 3 | 2H |
| Example 2 | Material B4 | 5 | Material A2 | 0 | | 3 | 2H |
| Example 3 | Material B5 | 8 | Material A1 | 0 | | 4 | 2H |
| Example 4 | Material B5 | 8 | Material A3 | 1 | | 4 | 2H |
| Example 5 | Material B5 | 8 | Material A4 | 2 | | 4 | 2H |
| Example 6 | Material B6 | 10 | Material A1 | 0 | | 4 | 2H |
| Example 7 | Material B7 | 12 | Material A2 | 0 | | 5 | 2H |
| Example 8 | Material B8 | 12 | Material A3 | 1 | | 5 | 2H |
| Example 9 | Material B9 | 12 | Material A4 | 2 | | 5 | 2H |
| Example 10 | Material B10 | 12 | Material A7 | 8 | | 5 | 2H |
| Example 11 | Material B11 | 12 | Material A8 | 10 | | 5 | H |
| Example 12 | Material B12 | 12 | Material A9 | 12 | | 5 | HB |
| Example 13 | Material B13 | 15 | Material A1 | 0 | | 5 | 2H |
| Example 14 | Material B14 | 20 | Material A2 | 0 | | 5 | 2H |
| Comparative Example 1 | Material B1 | 1 | Material A1 | 0 | | 1 | 2H |
| Comparative Example 2 | Material B2 | 2 | Material A2 | 0 | | 2 | 2H |

(Preparation of Image Display Device)

Films including the transparent laminated body previously produced in each example were affixed to a liquid crystal display element produced in accordance with the method described in paragraphs 0097 to 0119 of Japanese Patent Application Laid-Open (JP-A) No. 2009-47936, and a front face glass sheet were affixed, thereby preparing image display devices including the transparent laminated bodies of each example equipped with capacitance-type input devices as configuration elements in accordance with a known method.

<Capacitive Input Device and Image Display Device Evaluation>

The capacitance-type input devices and the image display devices including the transparent laminated body of each example were able to maintain corrosion resistance of the metal electrodes at a level that was not a problem in practice.

The second resin layer and the first resin layer also had no defects in terms of air bubbles and the like, and image display devices having excellent display characteristics were obtained.

The disclosure of Japanese Patent Application No. 2015-230619, filed Nov. 26, 2015, is incorporated herein by reference in its entirety.

All publications, patent applications, and technical standards mentioned in this specification are incorporated herein by reference to the same extent as if such individual publications, patent applications, and technical standards are specifically and individually indicated to be incorporated by reference.

What is claimed is:

1. A transfer material comprising, in this order, a temporary support body, a first resin layer, and a second resin layer,
   the first resin layer not being water soluble,
   the second resin layer including a water soluble polymer,
   the second resin layer including a compound that has a heteroaromatic ring including a nitrogen atom as a ring member, and
   a content of the compound that has a heteroaromatic ring including a nitrogen atom as a ring member in the second resin layer being 3.0% by mass or greater with respect to a total solid content of the second resin layer.

2. The transfer material of claim 1, wherein the content of the compound that has a heteroaromatic ring including a nitrogen atom as a ring member is from 3.0% by mass to 20.0% by mass with respect to the total solid content of the second resin layer.

3. The transfer material of claim 1, wherein the heteroaromatic ring including a nitrogen atom as a ring member is at least one ring selected from the group consisting of an imidazole ring, a triazole ring, a tetrazole ring, a thiadiazole ring, and a fused ring of any of these rings and another aromatic ring.

4. The transfer material of claim 1, wherein the compound that has a heteroaromatic ring including a nitrogen atom as a ring member is a benzotriazole compound.

5. The transfer material of claim 1, wherein the first resin layer either does not include a compound that has a heteroaromatic ring including a nitrogen atom as a ring member, or includes the compound that has a heteroaromatic ring including a nitrogen atom as a ring member in an amount of more than 0% by mass and 10.0% by mass or less with respect to a total solid content of the first resin layer.

6. The transfer material of claim 1, wherein the first resin layer includes a polymerizable compound and a photopolymerization initiator.

7. The transfer material of claim 1, wherein the first resin layer is an alkali-developable layer.

8. A laminated body manufactured by transferring the transfer material of claim 1 to above an electrode pattern positioned above a substrate and including a metal in at least a part of the electrode pattern.

9. A method of manufacturing a laminated body, the method comprising:
   transferring the first resin layer and the second resin layer from the transfer material of claim 1 to above an electrode pattern that is positioned above a substrate and that includes a metal in at least a part of the electrode pattern; and
   peeling off the temporary support body.

10. The method of manufacturing the laminated body of claim 9, further comprising patterning the first resin layer that has been transferred to above the electrode pattern.

11. A method of manufacturing a capacitance-type input device, the method comprising:
    transferring the first resin layer and the second resin layer from the transfer material of claim 1 to above an electrode pattern positioned above a substrate and including a metal in at least a part of the electrode pattern; and
    peeling off the temporary support body.

12. A method of manufacturing an image display device, the method comprising:
    transferring the first resin layer and the second resin layer from the transfer material of claim 1 to above an electrode pattern that is positioned above a substrate and that includes a metal in at least part of the electrode pattern; and
    peeling off the temporary support body.

13. A method of manufacturing a transfer material, the method comprising:
    forming a first resin layer on a temporary support body; and
    forming a second resin layer above the first resin layer,
    the first resin layer not being water soluble,
    the second resin layer including a water soluble polymer,
    the second resin layer including a compound that has a heteroaromatic ring including a nitrogen atom as a ring member, and
    a content of the compound that has a heteroaromatic ring including a nitrogen atom as a ring member in the second resin layer being 3.0% by mass or greater with respect to a total solid content of the second resin layer.

14. A laminated body comprising:
    a substrate;
    an electrode pattern that is positioned above the substrate and that includes a metal in at least part of the electrode pattern;
    a second resin layer positioned above the electrode pattern; and
    a first resin layer positioned above the second resin layer,
    the second resin layer including a compound that has a heteroaromatic ring including a nitrogen atom as a ring member.

15. The laminated body of claim 14, wherein the electrode pattern and the second resin layer are adjacent.

16. The laminated body of claim 14, wherein the second resin layer includes a water soluble polymer, and a content of the water soluble polymer in the second resin layer is from 2% by mass to 95% by mass with respect to a total solid content of the second resin layer.

17. The laminated body of claim 14, wherein the substrate is a film substrate.

18. The laminated body of claim 17, wherein each face of the film substrate includes the electrode pattern, the first resin layer, and the second resin layer.

19. The laminated body of claim 14, wherein the electrode pattern includes a metal wiring section.

20. The laminated body of claim 19, including a compound that has a heteroaromatic ring including a nitrogen atom as a ring member above the metal wiring section in a region from which the first resin layer and the second resin layer have been removed.

21. The laminated body of claim 14, wherein the first resin layer and the second resin layer are patterned.

\* \* \* \* \*